(12) United States Patent
Jones et al.

(10) Patent No.: US 9,558,135 B2
(45) Date of Patent: Jan. 31, 2017

(54) FLASHCARD READER AND CONVERTER FOR READING SERIAL AND PARALLEL FLASHCARDS

(76) Inventors: Larry Lawson Jones, Palo Alto, CA (US); Sreenath Mambakkam, San Jose, CA (US); Arockiyaswamy Venkidu, Menlo Park, CA (US)

( * ) Notice: Subject to any disclaimer, the term of this patent is extended or adjusted under 35 U.S.C. 154(b) by 685 days.

(21) Appl. No.: 13/451,275

(22) Filed: Apr. 19, 2012

(65) Prior Publication Data

US 2012/0203948 A1 Aug. 9, 2012

Related U.S. Application Data

(63) Continuation of application No. 11/479,523, filed on Jun. 30, 2006, now abandoned, which is a
(Continued)

(51) Int. Cl.
*G06F 13/38* (2006.01)
*G06K 7/00* (2006.01)
*G06F 13/40* (2006.01)
*G06F 3/06* (2006.01)
*G06K 19/077* (2006.01)
*H05K 5/02* (2006.01)

(52) U.S. Cl.
CPC ........... *G06F 13/387* (2013.01); *G06F 3/0646* (2013.01); *G06F 13/38* (2013.01); *G06F 13/385* (2013.01); *G06F 13/4027* (2013.01); *G06K 7/0013* (2013.01); *G06K 7/0073* (2013.01); *G06K 7/0043* (2013.01); *G06K 7/0052* (2013.01); *G06K 19/07741* (2013.01); *H05K 5/0282* (2013.01)

(58) Field of Classification Search
USPC ........................................................ 710/301
See application file for complete search history.

(56) References Cited

U.S. PATENT DOCUMENTS 3,821,518 A 6/1974 Miller
3,882,296 A 5/1975 Townsend
(Continued)

FOREIGN PATENT DOCUMENTS

CN 1278631 A 1/2001
EP 0549568 A2 6/1993
(Continued)

OTHER PUBLICATIONS

SD Group; "SD Memory Card Simplified Specifications—Part 1 Physical Layer Specification"; SD Group; version 0.96; Jan. 2000; all pages.*
(Continued)

*Primary Examiner* — Thomas J Cleary
(74) *Attorney, Agent, or Firm* — Edward P. Heller, III

(57) ABSTRACT

A flash memory card reader and a single converter chip for reading both serial and parallel flash cards. The read has connectors for both serial and parallel data transfer flash memory cards. The reader has a single chip converter. The converter supports both serial I/O and parallel I/O. The serial I/O transfers data in multiple modes. Both single-bit and multi-bit serial data transfers modes are supported. The reader may have multiple slots, one have a connector for serial and one having a connector for parallel flash memory cards.

19 Claims, 11 Drawing Sheets

Related U.S. Application Data continuation of application No. 10/167,925, filed on Jun. 11, 2002, now Pat. No. 7,222,205, which is a continuation of application No. 09/610,904, filed on Jul. 6, 2000, now Pat. No. 6,438,638.

(56) References Cited

U.S. PATENT DOCUMENTS

| | | | |
|---|---|---|---|
| 4,551,912 A | 11/1985 | Marks et al. | |
| 4,709,136 A | 11/1987 | Watanabe | |
| 4,710,419 A | 12/1987 | Gregory | |
| 4,801,561 A | 1/1989 | Sankhagowit | |
| 4,809,326 A | 2/1989 | Shigenaga | |
| 4,811,482 A | 3/1989 | Moll | |
| 4,868,047 A | 9/1989 | Hasegawa et al. | |
| 4,900,903 A | 2/1990 | Wright et al. | |
| 4,975,086 A | 12/1990 | Reichardt et al. | |
| 5,176,523 A * | 1/1993 | Lai | 439/64 |
| 5,184,282 A * | 2/1993 | Kaneda et al. | 361/737 |
| 5,200,959 A | 4/1993 | Gross et al. | |
| 5,220,488 A | 6/1993 | Denes | |
| 5,297,148 A | 3/1994 | Harari et al. | |
| 5,375,084 A | 12/1994 | Begun et al. | |
| 5,387,131 A | 2/1995 | Foreman et al. | |
| 5,396,617 A * | 3/1995 | Villwock et al. | 710/62 |
| D359,724 S | 6/1995 | Baginy | |
| 5,473,753 A | 12/1995 | Wells et al. | |
| 5,486,117 A | 1/1996 | Chang | |
| 5,535,328 A | 7/1996 | Harari et al. | |
| D372,708 S | 8/1996 | Hetherington | |
| 5,561,628 A | 10/1996 | Terada et al. | |
| 5,594,233 A | 1/1997 | Kenneth et al. | |
| 5,596,659 A | 1/1997 | Normile et al. | |
| 5,619,660 A * | 4/1997 | Scheer et al. | 710/301 |
| 5,625,534 A | 4/1997 | Okaya et al. | |
| 5,630,174 A * | 5/1997 | Stone et al. | 710/63 |
| 5,649,224 A * | 7/1997 | Scheer | 710/300 |
| 5,680,579 A | 10/1997 | Young et al. | |
| 5,687,592 A | 11/1997 | Penniman et al. | |
| 5,708,799 A * | 1/1998 | Gafken et al. | 710/301 |
| 5,712,472 A * | 1/1998 | Lee | 235/486 |
| 5,748,913 A | 5/1998 | Shibahara | |
| 5,750,973 A | 5/1998 | Kaufman et al. | |
| 5,773,901 A * | 6/1998 | Kantner | 307/125 |
| 5,799,200 A | 8/1998 | Brant et al. | |
| 5,818,029 A | 10/1998 | Thomson | |
| 5,839,108 A | 11/1998 | Daberko et al. | |
| 5,847,372 A * | 12/1998 | Kreft | 235/492 |
| 5,877,986 A | 3/1999 | Harari et al. | |
| 5,887,145 A * | 3/1999 | Harari et al. | 710/301 |
| 5,887,488 A | 3/1999 | Riggle | |
| 5,909,596 A * | 6/1999 | Mizuta | 710/63 |
| 5,928,347 A * | 7/1999 | Jones | 710/305 |
| 5,929,427 A | 7/1999 | Harada et al. | |
| 5,933,328 A * | 8/1999 | Wallace et al. | 361/737 |
| 5,991,546 A | 11/1999 | Chan et al. | |
| 6,002,605 A * | 12/1999 | Iwasaki et al. | 365/51 |
| 6,009,492 A * | 12/1999 | Matsuoka | 710/301 |
| 6,010,066 A * | 1/2000 | Itou et al. | 235/379 |
| 6,041,001 A | 3/2000 | Estakhri | |
| 6,062,887 A * | 5/2000 | Schuster et al. | 439/218 |
| 6,097,605 A * | 8/2000 | Klatt et al. | 361/737 |
| 6,108,730 A | 8/2000 | Dell et al. | |
| 6,110,576 A | 8/2000 | Decker et al. | |
| 6,112,014 A * | 8/2000 | Kane | 358/1.16 |
| 6,122,175 A | 9/2000 | Shieh | |
| 6,132,223 A * | 10/2000 | Seeley et al. | 439/76.1 |
| 6,134,114 A | 10/2000 | Ungermann et al. | |
| 6,137,710 A * | 10/2000 | Iwasaki et al. | 365/52 |
| 6,139,338 A | 10/2000 | Hirai et al. | |
| 6,145,046 A * | 11/2000 | Jones | 710/301 |
| 6,164,538 A | 12/2000 | Furuya et al. | |
| 6,168,077 B1 * | 1/2001 | Gray et al. | 235/375 |
| 6,173,405 B1 | 1/2001 | Nagel | |
| 6,174,188 B1 | 1/2001 | Martucci | |
| 6,176,721 B1 | 1/2001 | Gottardo et al. | |
| 6,190,182 B1 | 2/2001 | Liebenow et al. | |
| 6,230,226 B1 | 5/2001 | Hu et al. | |
| 6,243,686 B1 | 6/2001 | McPherson et al. | |
| 6,246,578 B1 | 6/2001 | Wei et al. | |
| 6,247,947 B1 | 6/2001 | Knoernschild et al. | |
| 6,266,724 B1 * | 7/2001 | Harari et al. | 710/301 |
| 6,279,061 B1 | 8/2001 | Aoki et al. | |
| 6,283,376 B1 | 9/2001 | Schuder et al. | |
| 6,285,555 B1 | 9/2001 | O'Neal et al. | |
| 6,292,863 B1 * | 9/2001 | Terasaki et al. | 710/313 |
| 6,307,538 B1 | 10/2001 | Bacon | |
| 6,311,290 B1 | 10/2001 | Hasbun et al. | |
| 6,337,712 B1 | 1/2002 | Shiota et al. | |
| 6,353,870 B1 * | 3/2002 | Mills et al. | 710/301 |
| 6,378,015 B1 | 4/2002 | Yen | |
| 6,385,667 B1 * | 5/2002 | Estakhri et al. | 710/8 |
| 6,386,920 B1 * | 5/2002 | Sun | 439/630 |
| 6,390,855 B1 | 5/2002 | Chang | |
| 6,393,524 B1 | 5/2002 | Ayers | |
| 6,402,259 B2 | 6/2002 | Corio et al. | |
| 6,402,529 B2 * | 6/2002 | Saito et al. | 439/74 |
| 6,402,558 B1 | 6/2002 | Hung-ju et al. | |
| 6,404,323 B1 | 6/2002 | Schrum et al. | |
| 6,405,323 B1 | 6/2002 | Lin et al. | |
| 6,408,352 B1 | 6/2002 | Hosaka et al. | |
| 6,412,080 B1 | 6/2002 | Fleming et al. | |
| 6,426,801 B1 * | 7/2002 | Reed | 358/1.16 |
| 6,427,186 B1 | 7/2002 | Lin et al. | |
| 6,438,638 B1 * | 8/2002 | Jones et al. | 710/301 |
| 6,442,734 B1 | 8/2002 | Hanson et al. | |
| 6,456,491 B1 | 9/2002 | Flannery et al. | |
| 6,457,647 B1 | 10/2002 | Kurihashi et al. | |
| 6,460,094 B1 | 10/2002 | Hanson et al. | |
| 6,470,284 B1 * | 10/2002 | Oh et al. | 702/64 |
| 6,471,130 B2 | 10/2002 | Iwasaki | |
| 6,477,604 B1 | 11/2002 | Chen | |
| 6,490,163 B1 | 12/2002 | Pua et al. | |
| 6,496,381 B1 | 12/2002 | Groeger | |
| 6,519,739 B1 | 2/2003 | Sandorfi | |
| 6,522,552 B1 | 2/2003 | Lee | |
| 6,523,079 B2 | 2/2003 | Kikinis et al. | |
| 6,523,132 B1 | 2/2003 | Harari et al. | |
| 6,532,152 B1 | 3/2003 | White et al. | |
| 6,535,997 B1 | 3/2003 | Janson et al. | |
| 6,557,754 B2 * | 5/2003 | Gray et al. | 235/375 |
| 6,561,421 B1 | 5/2003 | Yu | |
| 6,567,875 B1 | 5/2003 | Williams et al. | |
| 6,570,767 B1 | 5/2003 | Vapaakoski et al. | |
| 6,578,125 B2 | 6/2003 | Toba | |
| 6,581,830 B1 * | 6/2003 | Jelinek et al. | 235/441 |
| 6,595,803 B2 | 7/2003 | Akagi et al. | |
| 6,599,147 B1 | 7/2003 | Mills et al. | |
| 6,601,124 B1 * | 7/2003 | Blair | 710/305 |
| 6,607,707 B2 | 8/2003 | Reichman et al. | |
| 6,612,492 B1 * | 9/2003 | Yen | 235/451 |
| 6,612,498 B1 | 9/2003 | Lipponen et al. | |
| 6,628,524 B1 | 9/2003 | Washino et al. | |
| 6,641,413 B2 | 11/2003 | Kuroda | |
| 6,642,614 B1 | 11/2003 | Chen | |
| 6,651,149 B1 | 11/2003 | Iwasaki | |
| 6,658,202 B1 * | 12/2003 | Battaglia et al. | 386/231 |
| 6,658,516 B2 * | 12/2003 | Yao | 710/301 |
| 6,658,638 B2 | 12/2003 | Shau | |
| 6,661,454 B1 | 12/2003 | Hwang et al. | |
| 6,663,007 B1 | 12/2003 | Sun et al. | |
| 6,669,487 B1 | 12/2003 | Nishizawa et al. | |
| 6,681,991 B1 | 1/2004 | Li | |
| 6,684,283 B1 | 1/2004 | Harris et al. | |
| 6,687,778 B2 | 2/2004 | Ito et al. | |
| 6,688,521 B2 | 2/2004 | Cheng | |
| 6,699,053 B2 | 3/2004 | Kuroda | |
| 6,699,061 B2 | 3/2004 | Abe et al. | |
| 6,701,058 B1 | 3/2004 | Tsubaki | |
| 6,705,529 B1 * | 3/2004 | Kettunen et al. | 235/486 |
| 6,718,274 B2 | 4/2004 | Huang et al. | |
| 6,722,572 B2 | 4/2004 | Ono et al. | |
| 6,735,720 B1 | 5/2004 | Dunn et al. | |
| 6,738,259 B2 * | 5/2004 | Le et al. | 361/737 |

(56) References Cited

U.S. PATENT DOCUMENTS

| | | |
|---|---|---|
| 6,746,280 B1 | 6/2004 | Lu et al. |
| 6,751,694 B2* | 6/2004 | Liu et al. ............... 710/301 |
| 6,754,765 B1 | 6/2004 | Chang et al. |
| 6,761,313 B2 | 7/2004 | Hsieh et al. |
| 6,761,320 B1 | 7/2004 | Chen |
| 6,771,322 B1 | 8/2004 | Neifer |
| 6,780,062 B2 | 8/2004 | Liu et al. |
| 6,806,559 B2 | 10/2004 | Gann et al. |
| 6,830,474 B2 | 12/2004 | Liu et al. |
| 6,832,281 B2* | 12/2004 | Jones et al. ............. 710/301 |
| 6,836,885 B1 | 12/2004 | Buswell et al. |
| 6,839,864 B2* | 1/2005 | Mambakkam et al. ..... 714/5.11 |
| 6,857,907 B1 | 2/2005 | Hung et al. |
| 6,859,361 B1 | 2/2005 | Mambakkam et al. |
| 6,859,369 B2 | 2/2005 | Mambakkam et al. |
| 6,863,572 B1 | 3/2005 | Yi et al. |
| 6,880,024 B2* | 4/2005 | Chen et al. ............... 710/62 |
| 6,886,057 B2* | 4/2005 | Brewer et al. ............ 710/63 |
| 6,901,457 B1* | 5/2005 | Toombs et al. ........... 710/11 |
| 6,915,956 B2 | 7/2005 | Liu et al. |
| 6,920,517 B2* | 7/2005 | Mills et al. ............. 710/301 |
| 6,941,405 B2* | 9/2005 | Morrow ................... 710/305 |
| 6,945,461 B1 | 9/2005 | Hien et al. |
| 6,984,152 B2* | 1/2006 | Mowery et al. ........... 439/638 |
| 7,019,778 B1 | 3/2006 | Prabhu et al. |
| 7,020,739 B2 | 3/2006 | Mukaida et al. |
| 7,033,221 B2 | 4/2006 | Bricaud et al. |
| 7,038,665 B1 | 5/2006 | Pandana |
| 7,038,696 B2 | 5/2006 | Emerson et al. |
| 7,062,584 B1* | 6/2006 | Worrell et al. ........... 710/301 |
| 7,095,618 B1 | 8/2006 | Mambakkam et al. |
| 7,107,378 B1 | 9/2006 | Brewer et al. |
| 7,114,659 B2 | 10/2006 | Harari et al. |
| 7,114,993 B2 | 10/2006 | Chen |
| 7,126,926 B1 | 10/2006 | Bjorklund et al. |
| 7,152,801 B2 | 12/2006 | Cuellar et al. |
| 7,162,547 B2 | 1/2007 | Hosaka et al. |
| 7,162,549 B2 | 1/2007 | Mambakkam et al. |
| 7,177,975 B2 | 2/2007 | Toombs et al. |
| 7,191,270 B2 | 3/2007 | Oh et al. |
| 7,206,970 B1 | 4/2007 | Lauterbach et al. |
| 7,222,205 B2* | 5/2007 | Jones et al. ............. 710/301 |
| 7,231,643 B1 | 6/2007 | Galbo et al. |
| 7,236,193 B2 | 6/2007 | Suemoto et al. |
| 7,295,443 B2 | 11/2007 | Mambakkam et al. |
| 7,320,071 B1 | 1/2008 | Friedman et al. |
| 7,365,782 B2 | 4/2008 | Tanaka et al. |
| 7,367,503 B2 | 5/2008 | Harai et al. |
| 7,412,552 B2* | 8/2008 | Jones et al. ............. 710/301 |
| 7,493,437 B1 | 2/2009 | Jones et al. |
| 7,522,424 B2 | 4/2009 | Mambakkan et al. |
| 7,547,234 B2 | 6/2009 | Wallace |
| 7,594,064 B2 | 9/2009 | Aasheim et al. |
| 7,690,031 B2 | 3/2010 | Ma et al. |
| 2001/0004268 A1 | 6/2001 | Kubo et al. |
| 2001/0006400 A1 | 7/2001 | Kubo et al. |
| 2001/0009505 A1* | 7/2001 | Nishizawa et al. ........ 361/737 |
| 2001/0014934 A1 | 8/2001 | Toba |
| 2001/0016887 A1 | 8/2001 | Toombs et al. |
| 2001/0019077 A1 | 9/2001 | Buschmann |
| 2002/0032813 A1 | 3/2002 | Hosaka et al. |
| 2002/0040412 A1* | 4/2002 | Estakhri et al. ........... 710/11 |
| 2002/0065106 A1 | 5/2002 | Bishop et al. |
| 2002/0078297 A1 | 6/2002 | Toyama et al. |
| 2002/0078458 A1 | 6/2002 | Furon et al. |
| 2002/0080142 A1 | 6/2002 | Takase et al. |
| 2002/0111771 A1 | 8/2002 | Huang et al. |
| 2002/0113119 A1 | 8/2002 | Bessel et al. |
| 2002/0178307 A1* | 11/2002 | Pua et al. .................. 710/62 |
| 2002/0185533 A1* | 12/2002 | Shieh et al. ............. 235/441 |
| 2003/0038177 A1* | 2/2003 | Morrow .................. 235/441 |
| 2003/0041203 A1* | 2/2003 | Jones et al. ............. 710/301 |
| 2003/0041284 A1 | 2/2003 | Mambakkam et al. |
| 2003/0046469 A1* | 3/2003 | Liu et al. ............... 710/301 |
| 2003/0056050 A1* | 3/2003 | Moro ...................... 710/301 |
| 2003/0060085 A1 | 3/2003 | Reece |
| 2003/0074529 A1 | 4/2003 | Crohas et al. |
| 2003/0082961 A1 | 5/2003 | Mowery et al. |
| 2003/0084220 A1 | 5/2003 | Jones et al. |
| 2003/0084221 A1 | 5/2003 | Jones et al. |
| 2003/0088868 A1 | 5/2003 | Chang et al. |
| 2003/0093606 A1 | 5/2003 | Mambakkam et al. |
| 2003/0095194 A1 | 5/2003 | Suzuki et al. |
| 2003/0095386 A1* | 5/2003 | Le et al. .................. 361/737 |
| 2003/0109179 A1* | 6/2003 | Kaneshiro et al. ......... 439/638 |
| 2003/0112611 A1* | 6/2003 | Nishizawa et al. ........ 361/763 |
| 2003/0116624 A1 | 6/2003 | Chen |
| 2003/0129944 A1 | 7/2003 | Chang et al. |
| 2003/0133270 A1 | 7/2003 | Liu et al. |
| 2003/0156303 A1 | 8/2003 | Schnee et al. |
| 2003/0167376 A1 | 9/2003 | Koh |
| 2003/0168511 A1 | 9/2003 | Lin |
| 2003/0172219 A1 | 9/2003 | Yao |
| 2003/0172263 A1 | 9/2003 | Liu |
| 2003/0178486 A1 | 9/2003 | Teng et al. |
| 2003/0201322 A1 | 10/2003 | Wu |
| 2003/0229745 A1 | 12/2003 | Shih |
| 2003/0229746 A1* | 12/2003 | Liu et al. ............... 710/301 |
| 2004/0027879 A1 | 2/2004 | Chang |
| 2004/0030830 A1* | 2/2004 | Shimizu .................. 711/115 |
| 2004/0042323 A1 | 3/2004 | Moshayedi |
| 2004/0044864 A1 | 3/2004 | Cavallo |
| 2004/0059782 A1 | 3/2004 | Sivertsen |
| 2004/0060988 A1 | 4/2004 | Sakamoto et al. |
| 2004/0061780 A1 | 4/2004 | Huffman |
| 2004/0062109 A1 | 4/2004 | Wallace |
| 2004/0063464 A1 | 4/2004 | Akram et al. |
| 2004/0073736 A1 | 4/2004 | Oh et al. |
| 2004/0106326 A1 | 6/2004 | Hsieh |
| 2004/0110423 A1 | 6/2004 | Shishikura et al. |
| 2004/0215862 A1* | 10/2004 | Cedar et al. .............. 710/301 |
| 2005/0026505 A1 | 2/2005 | Washino |
| 2005/0273648 A1 | 12/2005 | Mambakkam et al. |
| 2006/0050155 A1 | 3/2006 | Ing et al. |
| 2006/0253636 A1* | 11/2006 | Jones et al. .............. 710/301 |
| 2007/0180291 A1 | 8/2007 | Galbo et al. |
| 2007/0283069 A1 | 12/2007 | Jones et al. |
| 2007/0283428 A1 | 12/2007 | Ma et al. |
| 2008/0009196 A1 | 1/2008 | Mambakkam et al. |
| 2008/0071978 A1 | 3/2008 | Chow et al. |
| 2008/0220654 A1 | 9/2008 | Guan et al. |
| 2008/0299809 A1 | 12/2008 | Mambakkam et al. |
| 2009/0100207 A1 | 4/2009 | Jones et al. |
| 2010/0138606 A1 | 6/2010 | Tanaka et al. |

FOREIGN PATENT DOCUMENTS

| | | |
|---|---|---|
| EP | 0744708 A2 | 11/1996 |
| EP | 833083 A1 | 12/1998 |
| EP | 1037159 A2 | 9/2000 |
| EP | 1146473 A1 | 10/2001 |
| EP | 1152426 A2 | 11/2001 |
| EP | 1688864 A1 | 8/2006 |
| EP | 1146428 B1 | 1/2008 |
| FR | 2722589 A1 | 1/1996 |
| FR | 2696863 A1 | 4/1997 |
| GB | 2263000 A | 7/1993 |
| JP | 03276382 A | 12/1991 |
| JP | 5108905 A | 4/1993 |
| JP | 10-154211 A | 6/1998 |
| JP | 10512067 A | 11/1998 |
| JP | 11-146328 A | 5/1999 |
| JP | 11184985 A | 7/1999 |
| JP | 11321019 A | 11/1999 |
| JP | 11321020 A | 11/1999 |
| JP | 2000099206 A | 4/2000 |
| JP | 2000181733 A | 6/2000 |
| JP | 2000200652 A | 7/2000 |
| JP | 2000-214970 A | 8/2000 |
| JP | 2000235463 A | 8/2000 |
| JP | 2000-286564 A | 10/2000 |
| JP | 2001022537 A | 1/2001 |
| JP | 2001022538 A | 1/2001 |
| JP | 2001-67303 A | 3/2001 |

(56) References Cited

FOREIGN PATENT DOCUMENTS

| | | |
|---|---|---|
| JP | 2002-157056 A | 5/2002 |
| JP | 2003-178269 A | 6/2003 |
| KR | 0317885 B1 | 7/2002 |
| WO | 9834218 A2 | 8/1998 |
| WO | 9859298 A1 | 12/1998 |
| WO | 9945461 A2 | 9/1999 |
| WO | 9948284 A1 | 9/1999 |
| WO | WO 9945461 A2 * | 9/1999 |
| WO | WO 0106443 A1 * | 1/2001 |
| WO | 0205102 A1 | 1/2002 |
| WO | 0213021 A2 | 2/2002 |
| WO | 2004027617 A1 | 4/2004 |

OTHER PUBLICATIONS

SD Card Association; "Simplified Specification"; SD Card Association; Retrieved Nov. 6, 2012; all pages.*
Ex parte ePlus, Inc.; Board of Patent Appeals and Interferences Decision; Appeal 2010-007804; May 18, 2011; all pages.*
Hiroshi, Takeyama et al., "The favorite of next generation IC card, fundamental and application of multimedia card usage [First]", Inteface Magazine, May 1, 2000, vol. 26, No. 5, pp. 166-174.
Hiroshi, Takeyama et al., "The favorite of next generation IC card, fundamental and application of multimedia card usage [Second]", Inteface Magazine, Jun. 1, 2000, vol. 26, No. 5, pp. 178-188.
ALCOR Micro Corp., "AU9360 USB Multiple Slots Flash Memory Card Reader Controller TRM, Datasheet Revision 1.2", Mar. 26, 2003.
Atmel Corporation, "Atmel 32-bit Embedded ASIC Core Peripheral: Multimedia Card Interface (MCI) Datasheet", Dec. 2001.
SCM Microsystems, "PC Card Reader/Writer PCD-47/PCD-47BH User's Manual, ver. 1.0", May 1, 1999, pp. 1-35.
Steve's Digicams, Review of Atech Flash Technology PRO II Flash Card Reader, May 9, 2002.
Investigation No. 337-TA-841, "Complainant Technology Properties Limited LLC's Responsive Claim Construction Brief", Jul. 23, 2012.
Investigation No. 337-TA-841, "Complainant Technology Properties Limited LLC's Opening Claim Construction Brief", Aug. 3, 2012.
ALCOR Micro Corp., "AU9331 USB Secure Digital Card Reader Technical Reference Manual, Rev. 1.2", 2002.
ALCOR Micro Corp., "AU9360 USB Multiple Slots Flash Memory Card Reader Controller TRM, Datasheet Revision 1.2".
Atmel Corporation, "Atmel 32-bit Embedded ASIC Core Peripheral: Multimedia Card Interface (MCI) Datasheet", 2001.
Atmel Corporation, "Atmel AT8xC51SNDIA Design Guide", 2002.
Business Wire, "Addonics Technologies Announces Internal Seven-in-One Flash MC Reader for Any Computer With a 3.5-unch Drive Bay", Mar. 26, 2002.
Phil Askey, "CARDport Swift Syncro (http://www.dpreview.com/reviews/chaseswiftsyncro)", Digital Photography Review, Aug. 2000.
CNET, "Review of Toshiba MEA-110", CNET Reviews, Aug. 18, 2001.
EDN, "Computers & Peripherals, 43, 23; ProQuest", Nov. 5, 1998, p. 244.
Cypress, "Cypress SL11Ride USB to IDE/ATAPI Solution Data Sheet", Nov. 30, 2001.
Epson America, Inc., "Epson Stylus Photo 825 Ink Jet Printer, Printer Basics Guide", Jul. 2002, pp. 1-114.
Fujitsu, FR30 32-bit Microcontroller MB91101/MB91101A Hardware Manual, Fujitsu Semiconductor Controller Manual, Jan. 27, 2000.
Fujitsu, "32-bit RISC Microcontroller CMOS FR30 MB91101 Series", Fujitsu Semiconductor Data Sheet.
SCM Microsystems Inc., "Dazzle 6-in-1 Reader User's Manual", 2002, pp. 1-59.

Jeff Keller, "DCRP Review: Panasonic ipalm PV-DC3000", Digital Camera Resource Page (http://www.dcresource.com/reviews/panasonic/dc3000-review/), Nov. 9, 2000.
Delkin Devices, "eFilm Reader-5 User's Manual, Rev 1.2 (Delkin Part No. DDREADER-05)", 2000, pp. 1-12.
Delkin Devices, "eFilm Reader-18 User's Manual Rev 1.0 (Delkin Part No. DDREADER-18)", 2002, pp. 1-12.
Digitalway Co., Ltd., "MPIO FL 100 User's Guide", Dec. 2002, pp. 1-48.
Genesys Logic, Inc., "GL813-USB2.0 CompactFlash Card Reader Controller Specification 1.2", Apr. 12, 2002.
Genesys Logic, Inc., "GL816-USB2.0 CompactFlash Card Reader Controller", Sep. 20, 2002.
Hewlett Packard, "HP Jornada 600 Series Handheld PC Quick Start Guide", 1999, pp. 1-2.
Hyundai, "HMS31C2816 FC Controller Specification ver. 1.0", System IC SBU, SP BU, MCU Business Division, IDA Team, 2001.
Anne-Birte Stensgaard, "Imation launches FlashGO! in the Middle East", www.ameinfo.com, Mar. 11, 2002.
Integrated Circuit Solution Inc., "IC1210-F128LQ—USB2.0 All-In-One Flash Card Reader Controller", 2002.
Intel Corp., "Intel PXA250 and PXA210 Applications Processors: Electrical, Mechanical, and Thermal Specification Datasheet", Feb. 2002, pp. 1-46.
Intel Corp., "Using SDCard and SDIO with the Intel PXA250 Applications Processor MMC Controller Application Note", Feb. 2002, pp. 1-16.
Microtech International, Inc., "Instruction Manual for ZiO card reader (available through Kyocera as SDR-1)", Jun. 2001.
Lexmark International, Inc., "Service Manual for 5000 and 5700 Color Jetprinter & 5770 Photo Jetprinter", Oct. 2000.
M2 Presswire, "New Sitecom intetnal Multi-Memory Reader/Writer offers easy transfer of flash media data", Aug. 1, 2002.
Steve's Digicams, "Memorex CardMate PCF-100 Flash Memory Card Reader User Review", Apr. 12, 1999, pp. 1-5.
Digital Photography Review, "Microtech unveil ZiO!, Review of ZiO! Reader", Retrieved from http://www.dpreview.com/news/2000/6/27/microtechzio, Jun. 27, 2000.
Peter Cohen, "Microtech ZiO! Works with Secure Digital Cards", Mac Publishing, LLC., Macworld.com (Retreived from http://www.macworld.com/article/1017398/zio.html), May 7, 2001.
Digital Photography Review, "Review of Dazzle Six in One USB card reader", (Retrieved from http://www.dpreview.com/news/2001/10/24/dazzle6in1), Oct. 24, 2001.
Cade Metz, "Review of LaCie Hexa Media Drive", pcmag.com (http://www.pcmag.com/article2/0,2817,3898,00.asp), Jun. 30, 2002.
Samsung Memory Product & Technology Division, "NAND/SmartMedia Technical Solution", Sep. 21, 2000.
Neodio Technologies Corporation, "ND3060—Multi-Format Card Reader/Writer Controller with USB Interface Specification", Apr. 4, 2001.
Olympus Optical Co.,Ltd., "Olympus Announces the Innovative 2.5 Megapixel C-2500L SLR Filmless Digital Camera", Aug. 24, 1999.
Olympus Optical Co.,Ltd., "Olympus C-2500L Filmless Digital Camera Datasheet", 1999.
Olympus Optical Co.,Ltd., "Olympus Camedia FlashPath Floppydisk Adapter MAFP-IE User's Manual", Dec. 2000.
Olympus Optical Co.,Ltd., "Olympus Document No. 2679: C-2500L FAQ's", May 26, 2000.
Olympus Optical Co.,Ltd., "Press Releases: Olympus Announces 32MB SmartMedia Card", Jun. 4, 1999.
Ngee, MokHeng, "Put it in the Bin", Computer Times, COMPTI, Aug. 28, 2002.
CSM GmbH, "OmniDrive Specification Sheet", Dec. 11, 2001, pp. 1-2.
M. Wiley, "Panasonic ipalm PV-DC3000 Review", (http://www.ign.com/articles/2001/10/12/panasonic-ipalm-pv-dc3000-review), IGN Entertainment, Inc., Oct. 12, 2001.
Panasonic, "PV-DC3000 Operating Instructions", Sep. 25, 2000, pp. 1-63.

(56) References Cited

OTHER PUBLICATIONS

MMCA Technical Committee, "The MultiMediaCard System Summary, Based onSystem Specification Version 2.2", Jan. 2000, pp. 1-27.
MMCA Technical Committee, "MultiMediaCard System Specification Version 2.11 Official Release", Jun. 1999 pp. 1-123.
SCM Microsystems, "PC Card Reader/Writer PCD-47/PCD-47BH", May 1, 1999, pp. 1-35.
Inv. No. 337-TA-841, Order Construing the Terms of the Asserted Claims of the Patents at ISSE, dated Oct. 4, 2012.
Inv. No. 337-TA-841, Respondents' Notice of Prior Art, dated Aug. 31, 2012.
Jason Cox, "Review of Microtech ZiO USB CompactFlash Card Reader", PCWorld (Retrieved from http://www.pcworld.com/product/407107/microtech_zio_usb_compactflash_card_reader_rating.html?p=review), Feb. 1, 2001.
Byrds Research & Publishing, Ltd, "Review of MindStor PSS-1705", iXBT Labs (http://ixbtlabs.com/articles/mindstor/index.html), Apr. 26, 2002.
Ian Burley, "Review of OmniFlash Uno Mas Universal Card Reader", Digital Photography Now, (Retrieved from http://dpnow.com/vintage/Features/Peripheral_reviews/perif2/perif2.html), Mar. 6, 2002.
Epinions.com, "Review of SmartDisk Dazzle 6-in-1 Reader (DM-8400)—The Dazzle DM-8400 Univeral Flash Card Reader—A Jack of All Trade", (http://www.epinions.com/review/cmhd-Components-All-SIX_IN_ONE_READER_W_DVD_S_W_DM8400/content_67507687044?sb=1), Jun. 20, 2002.
Samsung Electronics Memory Product & Technology Division, "Flash / SmartMedia File System Presentation", Feb. 2, 2000.
Samsung Electronics Memory Product & Technology Division, "Samsung presentation, SmartMedia Format Introduction (Software considerations)", Jul. 17, 1999.
Samsung Electronics, "Samsung's ATA Flash Controllers Reference Design Manual", Jan. 23, 2001.
Samsung Memory Product & Technology Division, "SmartMedia Application", Mar. 15, 2000.
SanDisk Corporation, "SanDisk MultiMedia Card Product Manual Rev 2", 2000, pp. 1-86.
SanDisk Corporation, "SmartMedia 32 Mbyte Product Manual Rev 1.1", 2001, pp. 1-54.
SCM Microsystems, "PC Card Reader/Writer PCD-47/PCD-47BH User's Manual, ver 1.0".
SD Association, "SD Card Specification, Simplified Version of: Part E1, Secure Digital Input/Output (SDIO) Card Specification", Oct. 2001.
SD Group, "Supplementary Notes for: SD Memory Card Specifications, Part 1, Physical Layer Specification, Version 1.0", Jun. 2000.
SD Association, "SD Memory Card File System Test Specification for SD Host Products, Version 1.0", Aug. 2001.
SD Group, "SD Memory Card Simplified Specifications, Part 1 Physical Layer Specification, Version 0.96", Jan. 2000, pp. 1-28.
SD Group, "SD Memory Card Specifications, Part 1, Physical Layer Specification, Version 1.0", Mar. 2000.
STMicroelectronics, "ST92163 Preliminary Data", Jan. 2000.
Steve's Digicam Online, Inc., "Review of Pixo Media 4-in-1 Multi PC-Card Adapter", Nov. 20, 2001.
Steve's Digicams Online, Inc., "Review of AcomData Multiflash USB Flash Card Reader/Writer", Jul. 18, 2001.
Steve's Digicams Online, Inc., "Review of BUSlink 6 in 1 Data Banker", Jan. 25, 2002.
Steve's Digicams Online, Inc., "Review of Dazzle 6 in 1 Reader", Jan. 28, 2002.
Steve's Digicam Online, Inc., "Review of Kyocera Finecam S-3", May 7, 2001.
Steve's Digicam Online, Inc., "Review of LexarMedia USB Universal Card Reader", Jan. 22, 2001.
Steve's Digicam Online, Inc., "Review of Panasonic iPalm PV-DC3000", Nov. 10, 2000.
Steve's Digicam Online, Inc. , "Review of Atech Flash Technology Pro II Flash Card Reader", (http://www.steves-digicams.com/2002_reviews/aft_pro2.html), May 9, 2002.
eMedia Asia Ltd., "TaiSol connector supports various media cards", EE Times Asia (http://www.eetasia.com/ART_8800226933_499491_NP_eb07bea3.HTM), Apr. 23, 2002.
TaiSol Electronics, "International patent awarded for 4-in-1 flash memory connector", Jul. 1, 2002.
Nan Barber, "The Aisle Less Traveled: A Macworld Expo Floor Report", MacDevCenter (http://www.macdevcenter.com/), O'Reilly Media, Inc., Jul. 18, 2002.
Toshiba Corporation, "Toshiba Companion Chip for TMPR3922U TC6358TB(PLUM2) Technical Data", Oct. 19, 1998.
Toshiba Corporation, "Toshiba Companion Chip for TX3922 PLUM2", Mar. 5, 1999.
Toshiba Corporation, "Owner's Manual of MEA110 Mobile Audio Player", available at least by Apr. 22, 2000, pp. 1-45.
Toshiba Corporation, "Toshiba SD Card Specification ver 2.11", May 31, 2002.
Toshiba Corporation, "SD Memory Card/SmartMedia Inteface Controller TC6377BF/TC6384AF Specification", Jun. 25, 2001.
Toshiba Corporation, "TC6374AF (3in1 ATA) PC Card ATA to SD Memory Card, Multimedia Card and SmartMedia Controller", Feb. 15, 2002.
Toshiba Corporation, "SD Memory Card / SDIO Card / SmartMedia Controller TC6380AF Outline", Apr. 10, 2002.
Wright, Mary, "To the Victor Will Go the Spoils in the Tiny-Flash-Card Battle", EDN Access, Jan. 16, 1997.
STMicroelectronics, "USB Flash Card Writer Using ST92163", Nov. 2000.
Viking Components, Inc., "Viking Intelliflash USB Flash Memory Reader User's Guide, Rev. B", May 2000.
Digital Photography Review, "Viking Announce IntelliFlash USB Flash Memory Reader", (Retrieved from http://www.dpreview.com/news/2000/3/21/viking), Mar. 21, 2000.
Kim, Jesung, et al., "A Space-Efficient Flash Translation Layer for Compactflash Systems", IEEE Transactions on Consumer Electronics, May 2002, vol. 48 No. 2 pp. 366-376.
Toshiba Corporation, Product Overview of MEA110 Mobile Audio Player, available at least by Apr. 22, 2000, pp. 287-298.
Texas Instruments, "Programming the TMS320VC5509 Multi Media Controller in Native Model—Application Report", Dec. 2001, pp. 1-13.
Motorola, Inc. "MPC8260 Power QUICC II—User's Manual", Apr. 1999, pp. 1-490.
Motorola, Inc. "MPC8260 Power QUICC II—User's Manual", Apr. 1999, pp. 491-1006.
SCM Microsystems, "SCSI Interface: PCD-47 series" (archived from www.scmmicro.com), May 1, 1999, pp. 1-2.
Youtube.com (http://www.youtube.com/watch?v=5Vr7YXDH4CQ), "1999 Sony DSC-D770 Digital Flash Media Camera Pro", Mar. 27, 2012.
Inv. No. 337-TA-841, Testimony of Stanley Moyer, Executive Director of the SD Association, p. 1297-1329, Dated Jan. 9, 2013.
Inv. No. 337-TA-841, ITC Investigation Open Session Trial Transcript, Dated Jan. 4, 2013-Jan. 10, 2013.

* cited by examiner

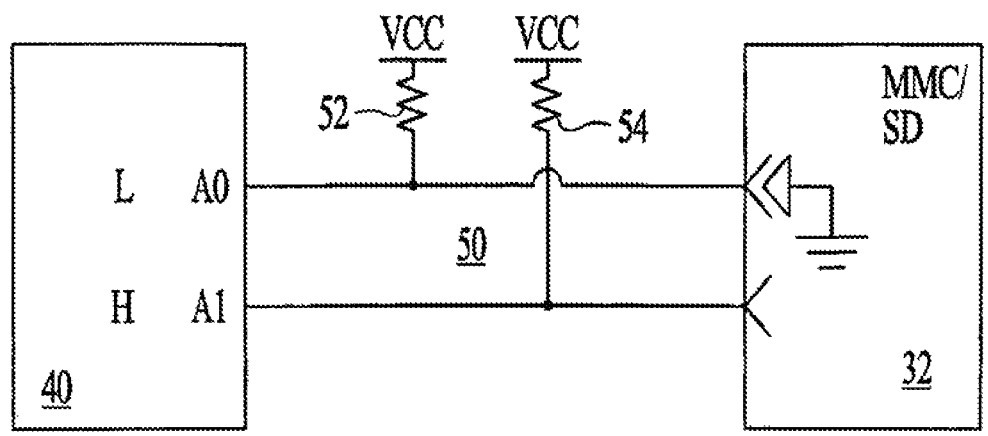
LH = MMC/SD  FIG. 4C
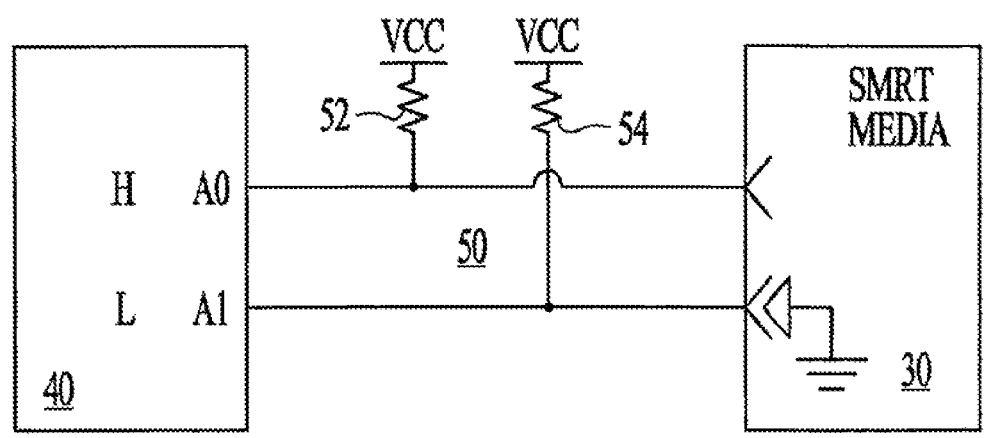
HL = SMRT MEDIA  FIG. 4D
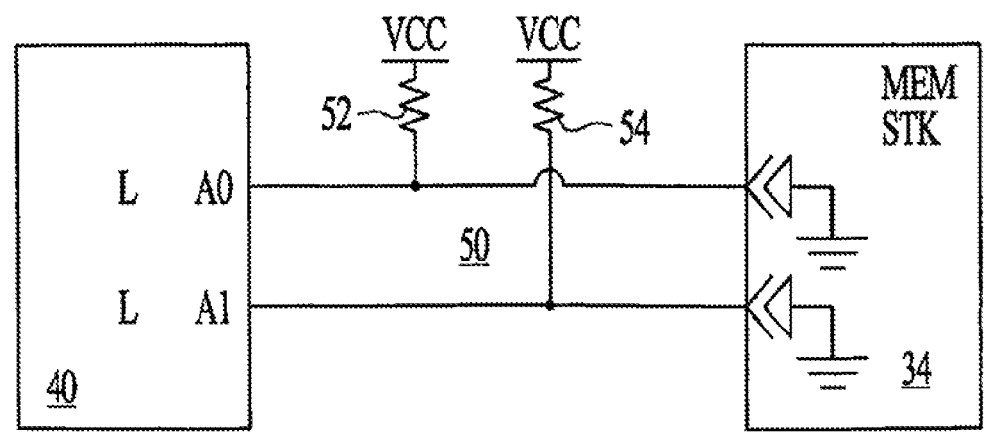
LL = MEM STK  FIG. 4E

| Pin | CF | Smart Media | MMC/SD | Memory Stick |
|---|---|---|---|---|
| 1 | Ground | Ground | Ground | Ground |
| 2 | D3 | D3 | — | — |
| 3 | D4 | D4 | — | — |
| 4 | D5 | D5 | — | — |
| 5 | D6 | D6 | — | — |
| 6 | D7 | D7 | — | — |
| 7 | -CE1 | -SMCS | — | — |
| 8 | A10 | — | — | — |
| 9 | -OE | -OE | — | — |
| 10 | A9 | — | — | — |
| 11 | A8 | — | — | — |
| 12 | A7 | — | — | — |
| 13 | Power | Power | Power | Power |
| 14 | A6 | CLE | | |
| 15 | A5 | ALE | | |
| 16 | A4 | READY | | |
| 17 | A3 | -WP | | |
| 18 | A2 | LVD | SCLK | SCLK |
| 19 | A1 | | DAT | DAT |
| 20 | A0 | | CMD | CMD |
| 21 | D0 | D0 | | |
| 22 | D1 | D1 | | |
| 23 | D2 | D2 | | |
| 24 | — | — | — | — |
| 25 | -CD2 | -CD2 | -CD2 | -CD2 |
| 26 | -CD1 | -CD1 | -CD1 | -CD1 |
| 27 | D11 | — | — | — |
| 28 | D12 | — | — | — |
| 29 | D13 | — | — | — |
| 30 | D14 | — | — | — |
| 31 | D15 | — | — | — |
| 32 | -CE2 | — | — | — |
| 33 | — | — | — | — |
| 34 | tie high | — | — | — |
| 35 | tie high | — | — | — |
| 36 | -WE | -WE | — | — |
| 37 | INTRQ | — | — | — |
| 38 | Power | Power | Power | Power |
| 39 | — | — | — | — |
| 40 | — | — | — | — |
| 41 | RESET | — | — | — |
| 42 | — | — | — | — |
| 43 | — | — | — | — |
| 44 | -REG | — | — | — |
| 45 | — | — | — | — |
| 46 | — | — | — | — |
| 47 | D8 | — | — | — |
| 48 | D9 | — | — | — |
| 49 | D10 | — | — | — |
| 50 | Ground | Ground | Ground | Ground |

FIG. 5

FLASHCARD READER AND CONVERTER FOR READING SERIAL AND PARALLEL FLASHCARDS

CROSS-REFERENCES TO RELATED APPLICATIONS

Under 35 U.S.C. §120, this application is a continuation application of U.S. application Ser. No. 11/479,523, filed Jun. 30, 2006, which is a continuation application of U.S. application Ser. No. 10/167,925, which was filed on Jun. 11, 2002, now U.S. Pat. No. 7,222,205, which is a continuation application of U.S. application Ser. No. 09/610,904 which was filed Jul. 6, 2000 and issued as U.S. Pat. No. 6,438,638 on Aug. 20, 2002, and is titled "Flashtoaster for Reading Several Types of Flash Memory Cards With or Without a PC", the priority of which is hereby claimed, and the entirety of which are incorporated herein by reference, and all of which are assigned to the assignee of the present invention.

FIELD OF THE INVENTION

This invention relates to flash-memory readers, and more particularly for interfacing several different types of flash-memory cards to a personal computer.

BACKGROUND OF THE INVENTION

Digital cameras have become one of the most popular of electronic devices. In a recent year, more digital cameras were sold than traditional film cameras. Images from digital cameras can be downloaded and stored on personal computers. Digital pictures can be converted to common formats such as JPEG and sent as e-mail attachments or posted to virtual photo albums on the Internet. Video as well as still images can be captured, depending on the kind of digital camera.

Digital cameras typically capture images electronically and ultimately store the images as bits (ones and zeros) on a solid-state memory. Flash memory is the most common storage for digital cameras. Flash memory contains one or more electrically-erasable read-only-memory (EEPROM) integrated circuit chips that allow reading, writing, and block erasing.

Early digital cameras required the user to download or transfer the images from the flash memory within the digital camera to a personal computer (PC). A standard serial cable was most widely used. However, the limited transfer rate of the serial cable and the large size of the digital images made such serial downloads a patience-building experience. Serial downloads could easily take half an hour for only a few dozen images.

Digital camera manufacturers solved this problem by placing the flash memory chips on a small removable card. The flash-memory card could then be removed from the digital camera, much as film is removed from a standard camera. The flash-memory card could then be inserted into an appropriate slot in a PC, and the image files directly copied to the PC.

FIG. 1A shows a flash memory card and adapter for transferring images from a digital camera to a PC. A user takes pictures with digital camera 14 that are stored in image files on flash memory chip(s). The flash memory chip is contained in CompactFlash card 16, which can be removed from digital camera 14 by pressing a card-eject button. Thus CompactFlash card 16 contains the image files.

While some smaller hand-held computers or personal-digital-assistants (PDA) have slots that receive Compact-Flash cards, most PC's do not. Laptop or notebook PC's have PC card (earlier known as PCMCIA, Personal Computer Memory Card International Association) slots that can receive PCMCIA cards. Many functions have been placed on PCMCIA cards, such as modems, Ethernet, flash memory, encryption keys, and even miniature hard drives.

CF-to-PCMCIA adapter 10 is a passive adapter that contains an opening that receives CompactFlash card 16. FIG. 1B shows CF-to-PCMCIA adapter 10 with Compact-Flash card 16 inserted. Such CF-to-PCMCIA adapters 10 sell for as little as $5-10. CompactFlash is a trademark of SanDisk Corp. of Sunnyvale, Calif.

FIG. 1C shows a PC connected to a PCMCIA reader. Most laptop and notebook PC's contain one or two PCMCIA slots 22 that CF-to-PCMCIA adapter 10 can fit into. Then the user merely has to copy the image files from CompactFlash card 16 to the hard disk of PC 20. Since high-speed parallel buses are used, transfer is rapid, about the same speed as accessing the hard disk. Thus a half-hour serial-cable transfer can be reduced to less than a minute with the $5 CF-to-PCMCIA adapter.

Desktop PC's usually do not have PCMCIA slots. Then PCMCIA reader 12 can be used. PCMCIA reader 12 accepts CF-to-PCMCIA adapter 10 and connects to PC 20 through a parallel or high-speed Universal Serial Bus (USB) cable.

Multiple Flash-Card Formats

Although the CompactFlash card format is relatively small, being not much more than an inch square, other smaller cards have recently emerged. FIG. 2A illustrates various formats of flash-memory cards used with digital cameras. Many digital cameras still, use CompactFlash card 16, which can be inserted into CF-to-PCMCIA adapter 10 for transfer to a PC. Other smaller, thinner formats have emerged and are used with some manufacturer's digital cameras. For example, SmartMedia card 24 is less than half, an inch long, yet has enough flash memory capacity for dozens of images. SmartMedia-to-PCMCIA adapter 10' is available commercially for about $60. The higher cost is believed to be due to a converter chip within adapter 10'. Also, different adapters 10' are required for different memory capacities of SmartMedia card 24. SmartMedia is a trademark of the SSFDC Forum of Tokyo, Japan.

Other kinds of flash-memory cards that are being championed by different manufacturers include MultiMediaCard (MMC) 28 and the related Secure Digital Card (SD) 26. MMC is a trademark of SanDisk Corp. of Sunnyvale, Calif. while SD is controlled by the SD Group that includes Matsushita Electric Industrial Co., SanDisk Corporation, Toshiba Corp. Another emerging form factor from SONY is Memory Stick 18. Memory Stick has a PCMCIA/Floppy adapter while MMC has a floppy adapter.

The different physical shapes and pin arrangements of cards 24, 26, 28 and Memory Stick 18 prevent their use in CF-to-PCMCIA adapter 10. Indeed, most of these cards 24, 26, 28 have less than a dozen pins, while CompactFlash card 16 has a larger 50-pin interface. Furthermore, serial data interfaces are used in the smaller cards 24, 26, 28 while a parallel data bus is used with CompactFlash card 16.

FIG. 2B shows a Memory Stick-to-PCMCIA adapter, using an active converter chip. Memory Stick 18 fits into an opening in Memory Stick-to-PCMCIA adapter 15, allowing adapter 15 and the Memory Stick to be plugged into a standard PCMCIA slot on a PC. However, adapter 15 has an integrated circuit (IC) converter chip 11 within it. Converter chip 11 may be needed to convert the serial data format of Memory Stick 18 to the parallel data format of a 68-pin PCMCIA slot. Inclusion of converter chip 11 in adapter 15 significantly increases the cost and complexity of adapter 15 compared to CF-to-PCMCIA adapter 10 which is a passive adapter without a converter chip.

While the advances in flash-memory card technology are useful, the many different cards formats present a confusing array of interface requirements to a PC. Different adapters are needed for each of the card formats. PCMCIA card reader 12 can be replaced with other format readers, such as a SmartMedia Card reader, and even some multi-standard readers are available, such as a universal reader from Lexar Media that reads CompactFlash or SmartMedia in addition to PCMCIA.

What is desired is a universal adapter for flash-memory cards of several different formats. An adapter that accepts SmartMedia, MultiMediaCard, Secure Digital, and Memory Stick cards is desired. A flash-card reader with a single slot that accepts any format card using the adapter is desired. Special detection logic on the flash reader is desired to distinguish between the many flash-card formats is desirable. A low-cost passive adapter is desired that does not need an expensive converter chip. A multi-format reader is desired for a PC. A stand-alone flash reader is desired that can copy image files from flash cards without a PC is also desired.

SUMMARY OF THE INVENTION

A single-slot multi-flash-card reader has a personal computer interface for transferring data to a personal computer. A converter means is coupled to the personal computer interface. It converts multiple flash-card interfaces to a format used by the personal computer interface. The multiple flash-card interfaces include a CompactFlash interface and smaller interfaces having fewer pins than the CompactFlash interface.

A CompactFlash connector is coupled to the converter means. It receives a CompactFlash card through a single slot in the single-slot multi-flash-card reader. The CompactFlash connector makes electrical connection with the CompactFlash card for signals in the CompactFlash interface.

An adapter has a physical shape to removably insert into the CompactFlash connector. The adapter has a mating CompactFlash connector that fits the CompactFlash connector. The adapter also has a smaller connector. The smaller connector fits to other flash-memory cards having the smaller interfaces.

A wiring means in the adapter connects between the smaller connector and the mating CompactFlash connector. It directly connects signals from the smaller connector in the smaller interface with signals in the mating CompactFlash connector. Thus the adapter allows the other flash-memory cards having the smaller interfaces to fit into the CompactFlash connector through the single slot to be read by the converter means.

In further aspects the wiring means connects card select signals from all of the smaller interfaces to card select signals in the CompactFlash connector. The converter means includes a card-detect means that is coupled to sense the card select signals. It detects presence of a flash-memory card inserted into the CompactFlash connector. Thus the converter means detects presence of CompactFlash and the other flash-memory cards having the smaller interfaces.

BRIEF DESCRIPTION OF THE DRAWINGS

FIGS. 4A-E show card-type detection using the A1, A0 pins of the CompactFlash reader interface.

FIG. 5 is a table of pin mappings for the SmartMedia, MMC/SD, and Memory Stick to CompactFlash adapters.

DETAILED DESCRIPTION

The present invention relates to an improvement in flash-memory card readers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a universal adapter can be constructed using the CompactFlash card form factor. A reader that reads CompactFlash cards can then read any of the other flash-memory cards that plug into the CompactFlash adapter. The adapters are simple, inexpensive passive adapters without a conversion chip.

The inventors have found a pin mapping from the smaller flash-card formats to CompactFlash that allows for easy detection of the type of flash-memory card inserted into the adapter. Detection of the type of flash-memory card is thus performed automatically by electronic detection by the CompactFlash reader. The CompactFlash reader is modified to perform this card-type detection. Signal conversion such as serial-to-parallel is performed by the CompactFlash reader rather than by the adapter. Adapter costs are reduced while CompactFlash reader cost is increased only slightly. The CompactFlash reader can use a single CompactFlash slot to read multiple flash-card types, including SmartMedia, MultiMediaCard, Secure Digital, Memory Stick, and CompactFlash.

In another embodiment, the CompactFlash reader is somewhat larger, and has multiple slots. The adapter is not needed in this embodiment. Instead, a slot is provided for each of the flash-memory card formats—SmartMedia, MultiMediaCard, Secure Digital, Memory Stick, and CompactFlash. A PCMCIA can also be added.

This CompactFlash reader can be connected to the PC by a USB cable, or it can be located within the PC chassis.

In a third embodiment, the CompactFlash reader is a stand-alone device that can operate without a PC. A removable disk media such as a R/W CD-ROM is included. Images from the flash-memory card are copied to the removable disk media by the CompactFlash reader. A simple interface is used, such as having the user press a button to initiate image transfer.

Figure 1A:
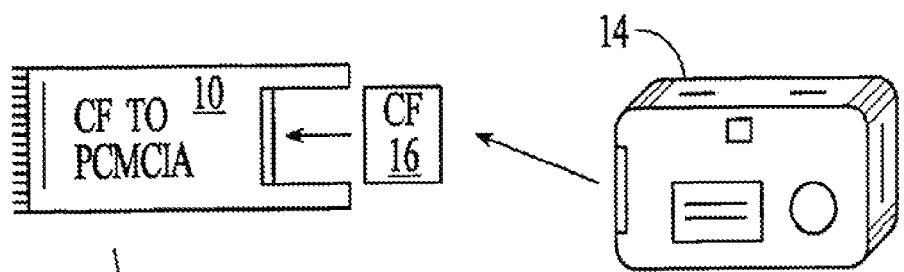
FIG. 1A shows a flash memory card and adapter for transferring images from a digital camera to a PC.
Figure 1B:
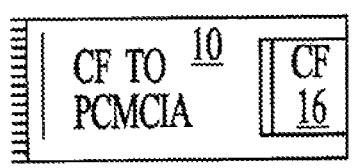
FIG. 1B shows CF-to-PCMCIA adapter 10. with CompactFlash card 16 inserted
Figure 1C:
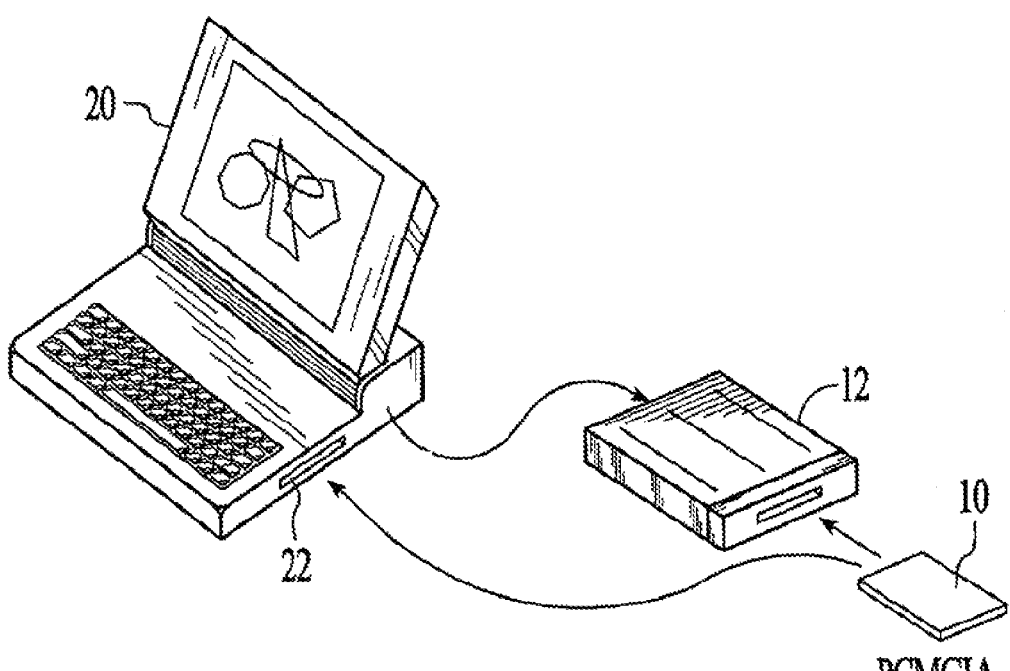
FIG. 1C shows a PC connected to a PCMCIA reader.
Figure 2A:
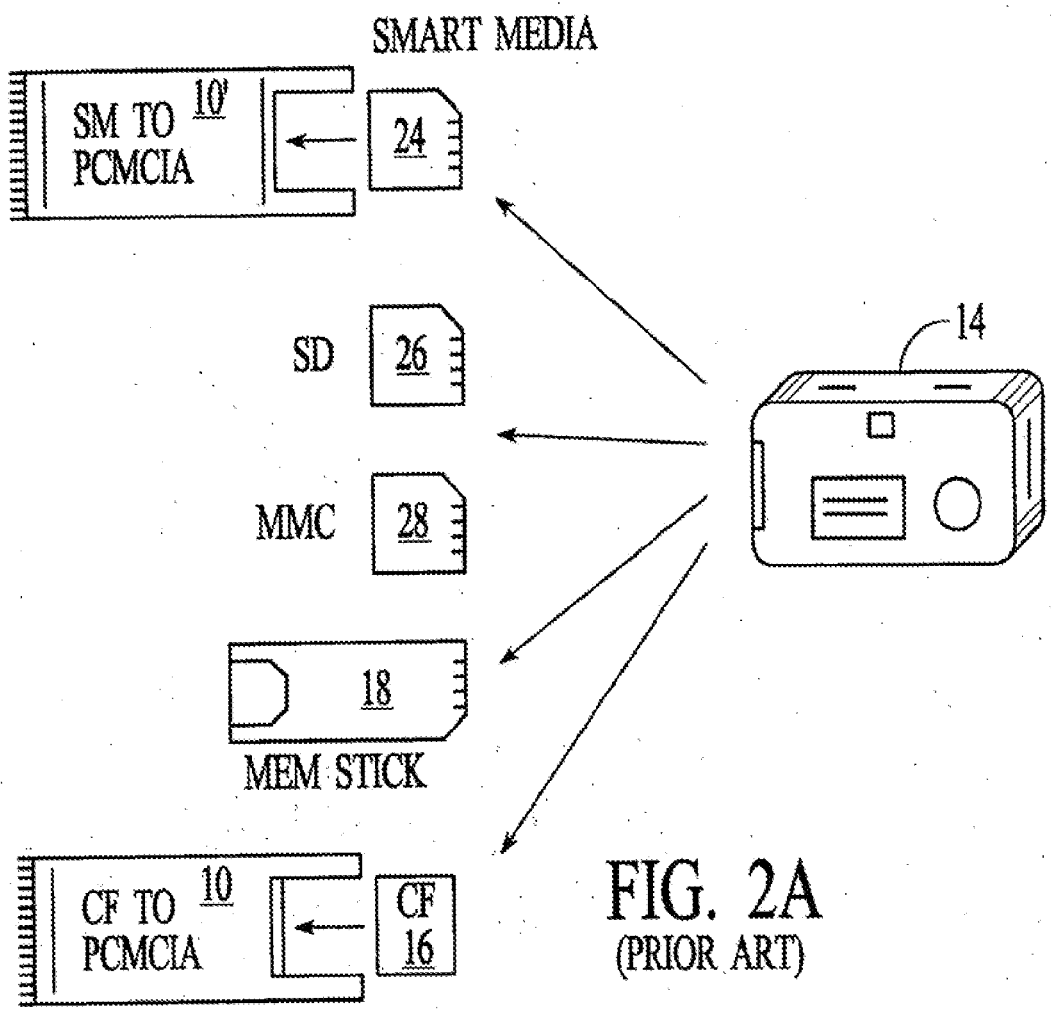
FIG. 2A illustrates various formats of flash-memory cards used with digital cameras.
Figure 2B:
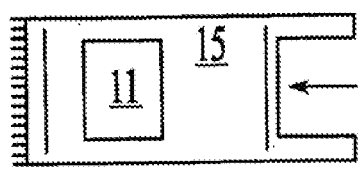
FIG. 2B shows a Memory Stick-to-PCMCIA adapter using an active converter chip.
Figure 3A:
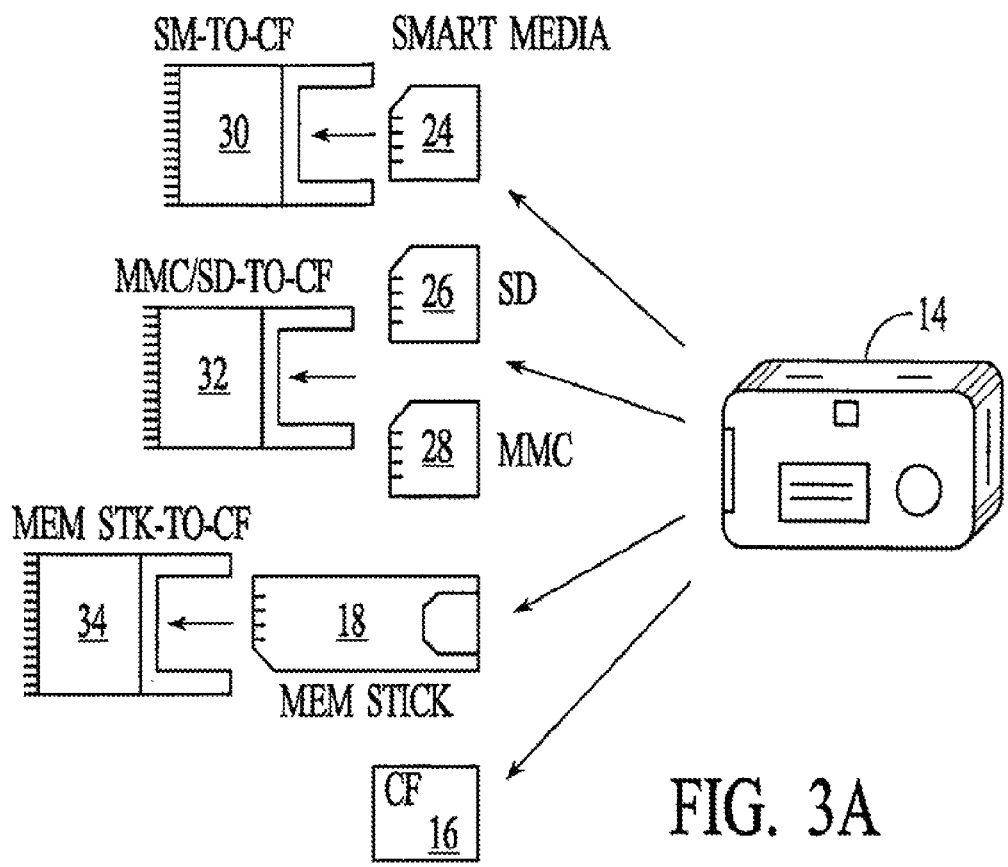
FIG. 3A shows a universal CompactFlash adapter that accepts SmartMedia, MultiMediaCard, Secure Digital, and Memory Stick flash-memory cards.
Figure 3B:
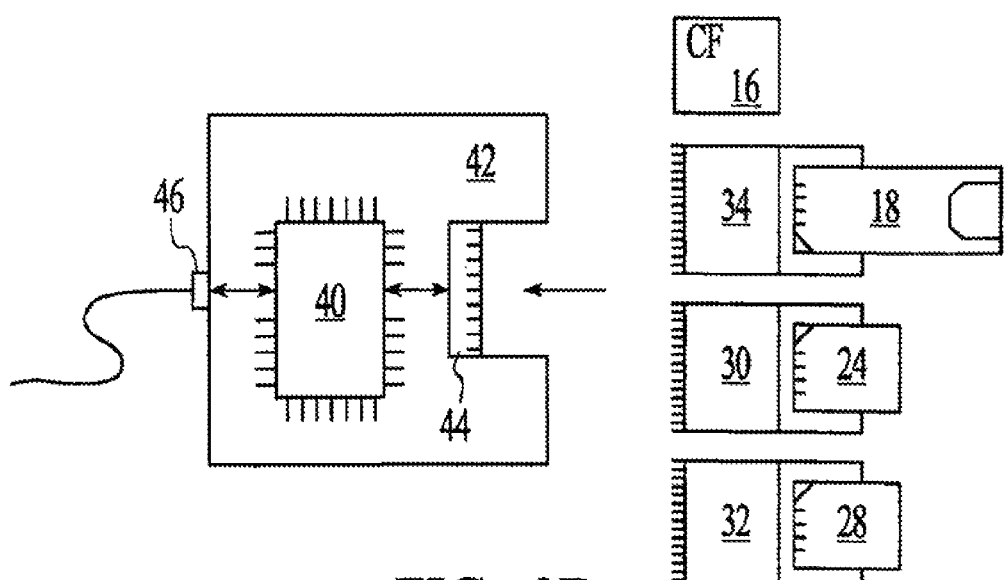
FIG. 3B shows a CompactFlash reader that reads SmartMedia, MultiMediaCard, Secure Digital, and Memory Stick flash-memory cards through passive adapters to the CompactFlash form factor.

Universal, Passive Adapters—FIGS. 3A-B

FIG. 3A shows a universal CompactFlash adapter that accepts SmartMedia, MultiMediaCard, Secure Digital, and Memory Stick flash-memory cards. Digital camera 14 stores images on flash memory that is in one of several card types. CompactFlash card 16 uses a 50-pin connector and transfers image data in a 16-bit parallel format.

SmartMedia card 24 is smaller flash-memory card with a 22-pin interface and transfers data in an 8-bit parallel format. SmartMedia adapter 30 converts the 22pin SmartMedia interface to fit within the 50-pin CompactFlash interface. When SmartMedia card 24 is plugged into SmartMedia adapter 30, both can be plugged into a CompactFlash slot on a CompactFlash reader. Of course, ordinary CompactFlash readers will not be able to read SmartMedia card 24 since special signal conversion is required by the CompactFlash reader.

MultiMediaCard 28 and Secure Digital card 26 are flash-memory cards with similar 9-pin interfaces. Serial data transfer is used through a single Data I/O pin. MMC/SD adapter 32 has an opening with a 9-pin connector to receive either MultiMediaCard 28 or Secure Digital card 26. Once MultiMediaCard 28 or Secure Digital card 26 is inserted into MMC/SD adapter 32, then MMC/SD adapter 212 can be inserted into a CompactFlash slot on a special CompactFlash reader. The CompactFlash reader then detects the card type and performs serial-to-parallel conversion.

Memory Stick 18 is also a flash-memory card with a 9-pin, serial-data interface, but is narrower and longer than MultiMediaCard 28 or Secure Digital card 26. Memory Stick adapter 34 has an opening with a 10-pin connector to receive Memory Stick 18. Once Memory Stick 18 is inserted, Memory Stick adapter 32 can itself be inserted into a CompactFlash slot on a special CompactFlash reader. The CompactFlash reader then detects the card type and performs serial-to-parallel conversion.

FIG. 3B shows a CompactFlash reader that reads SmartMedia, MultiMediaCard Secure Digital, and Memory Stick flash-memory cards through passive adapters to the CompactFlash form factor. CompactFlash reader 42 has an opening or slot with 50-pin connector 44 that accepts CompactFlash card 16. Controller chip 40 performs handshaking with CompactFlash card 16 and performs data transfer. CompactFlash reader 42 also connects to a PC over USB connector 46. Controller chip 40 also controls the USB interface to the host PC, allowing image files to be transferred to the PC from CompactFlash card 16.

Other kinds of flash-memory cards can also be read by CompactFlash reader 42 For example, adapter 34 allows Memory Stick 18 to be read. Memory Stick adapter 34 has an opening that Memory Stick 18 fits into, while Memory Stick adapter 34 itself fits into 50-pin connector 44, since adapter 34 has the same form factor as a CompactFlash card.

SmartMedia card 24 can also be read by CompactFlash reader 42, using SmartMedia adapter 30. Likewise, MultiMediaCard 28 or Secure Digital card 28 can be read using MMC/SD adapter 32.

Adapters 30, 32, 34 are passive adapters that only connect pins from the smaller flash-memory cards to the 50-pin CompactFlash connector. An active converter chip is not required, greatly reducing cost and complexity.

Detection of Card Type—FIGS. 4A-E.

FIGS. 4A-E detail detection of the type of flash-memory card by the CompactFlash reader. Since the same CompactFlash slot is used for many kinds of flash-memory cards, a detection method is useful so that the user doesn't have to explicitly indicate what type of flash-memory card is inserted into the CompactFlash reader.

The inventors have carefully examined the pins of the interfaces to the various flash-memory cards and have discovered that type-detection can be performed by examining two address pins. Address pins A0 and A1 are the leastsignificant-bits (LSB) of the address of the 50-pin CompactFlash interface. These pins are normally inputs to the CompactFlash card and thus are driven by the CompactFlash reader. When the reader does not drive A0, A1 to the inserted CompactFlash card, the A0, A1 pins float or are pulled high by pullup resistors.

Address pins are not present on the other kinds of flash-memory cards. Instead, the address and data are multiplexed. For MMC/SD and Memory Stick, the address is sent serially. Using the adapters, pins from the other flash-memory cards can be connected to the CompactFlash pins. Pins A0 and A1 are used to detect the type of card. For SmartMedia, the addresses are sent by using a special control sequence followed by 3 or 4 bytes of starting address.

Figure 4A:
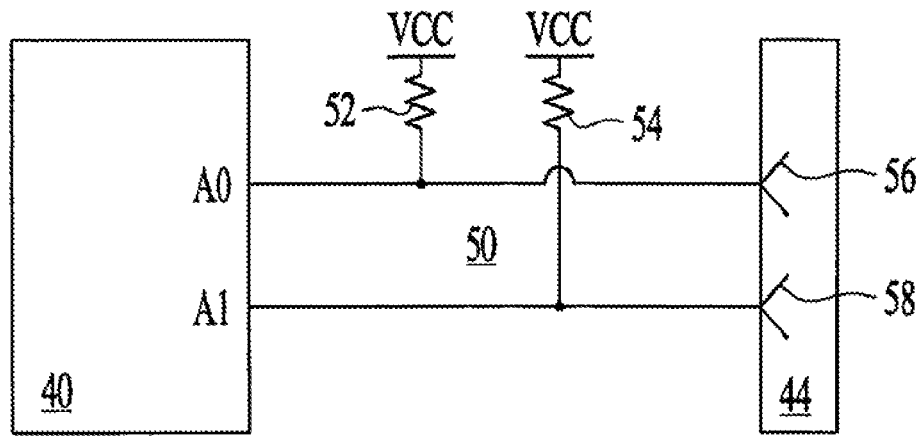

In FIG. 4A, the A1, A0 pins of the CompactFlash reader interface are highlighted Converter chip 40 in the CompactFlash reader normally drives all 11 address pins in the CompactFlash interface when reading a CompactFlash card plugged into connector 44. The A0 pin from the CompactFlash card plugs into connector cup 56, while the A1 pin from the CompactFlash card plugs into connector cup 58 of 50-pin connector 44.

Card-type detector 50 has two pullup resistors added to lines A0, A1. Resistor 52 pulls line A0 high to power (Vcc) when neither converter chip 40 nor a card plugged into connector 44 drives line A0. Likewise, resistor 54 pulls line A1 high when line A1 is not being actively driven. During detection mode, converter chip 40 is programmed to not drive lines A0, A1 and instead use then as inputs to the detector logic.

Figure 4B:
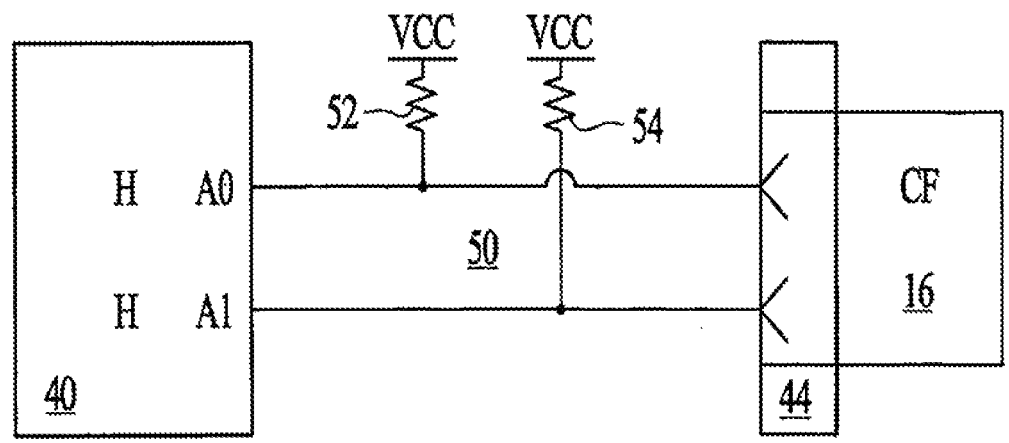

In FIG. 4B, a CompactFlash card is inserted into the connector for card-type detection. CompactFlash card 16 is plugged into connector 44. Since A0 and A1 are inputs to CompactFlash card 16, they are not driven by CompactFlash card 16. During detection mode, converter chip 40 also does not drive pins A0, A1. Thus lines A0, A1 are left floating and are each pulled high by resistors 52, 54.

Detection logic in converter chip 40 reads card-select pins CD0, CD1 to detect the presence of a flash-memory card. When a new card is present, detection logic then reads pins A0, A1 as inputs. Both inputs are high. The detection logic in converter chip 40 recognizes the LH state of A0, A1 as indicating that a CompactFlash card is plugged into connector 44. Converter chip 40 then exits detection mode and configures its interface to connector 44 for the 50-pin CompactFlash interface as shown later in FIG. 5.

In FIG. 4C, a MultiMediaCard or Secure Digital card is inserted into the connector for card-type detection. MMC/

SD card 28 (not shown) is plugged into MMC/SD adapter 32 which is plugged into connector 44.

Converter chip 40 does not drive pins A1, A0 during detection mode. Thus pin A1 floats and is pulled high by resistor 54. The A0 pin is driven low by the MMC card.

Detection logic in converter chip 40 reads card-select pins CD0, CD1 to detect the presence of a flash-memory card. When a new card is present, detection logic then reads pins A0, A1 as inputs. While A0 is low, A1 is high. The detection logic in converter chip 40 recognizes the HL state of A0, A1 as indicating that a MMC or SD card is plugged into connector 44. Converter chip 40 then exits detection mode and configures its interface to connector 44 for the 9-pin MMC/SD interface as shown later in FIG. 5.

In FIG. 4D, a SmartMedia card is inserted into the connector for card-type detection. SmartMedia card 24 (not shown) is plugged into SmartMedia adapter 30 which is plugged into connector 44. The adapter 30 does not connect pins A0, A1 from the CompactFlash interface to any pins on the SmartMedia card. Adapter 30 internally connects pin A1 from the CompactFlash interface to the ground pin on the CompactFlash interface.

The SmartMedia card does not drive either pin A1, A0, although adapter 30 drives pin A1 low. Likewise, converter chip 40 does not drive pins A1, A0 during detection mode. Pin A0 floats and is pulled high by resistor 52.

Detection logic in converter chip 40 reads card-select pins CD0, CD1 to detect the presence of a flash-memory card. When anew card is present, detection logic then reads pins A0, A1 as inputs. While A0 is high, A1 is low. The detection logic in converter chip 40 recognizes the HL state of A0, A1 as indicating that a SmartMedia card is plugged into connector 44. Converter chip 40 then exits detection mode and configures its interface to connector 44 for the 22-pin SmartMedia interface as shown later in FIG. 5.

In FIG. 4E, a Memory Stick card is inserted into the connector for card-type detection. Memory Stick card 18 (not shown) is plugged into Memory Stick adapter 34 which is plugged into connector 44.

Detection logic in converter chip 40 reads card-select pins CD0, CD1 to detect the presence of a flash-memory card. When a new card is present, detection logic then reads pins A0, A1 as inputs. Both pins A0, A1 are low. The detection logic in converter chip 40 recognizes the LL state of A0, A1 as indicating that a Memory Stick card is plugged into connector 44.

Pin Mapping—FIG. 5

FIG. 5 is a table of pin mappings for the SmartMedia, MMC/SD, and Memory Stick to CompactFlash adapters. The pin numbers for the smaller interfaces for SmartMedia, MMC/SD, and Memory Stick are not shown but can be in any order or designation. The adapter connects the proper pin on the smaller interface to the CompactFlash pin number shown in FIG. 5. Simple wiring such as individual wires, flat cables, printed-circuit board (PCB), or wiring traces can be used.

The ground pins on the smaller interfaces are connected to CompactFlash pins 1 and 50. Power pins are connected to CompactFlash pins 13, 38. Pins 25, 26 are the card detect signals for CompactFlash, which the adapters connect to the card-detect signals on all smaller interfaces.

The CompactFlash connectors use pins 2-6, 21-23, 27-31, and 47-49 for the 16-bit parallel data bus to the Compact-Flash card. Pins 8, 10-12, and 14-20 form a separate 11-bit address bus. The separate data and address buses provide for rapid random addressing of CompactFlash cards. Other control signals include pins 6, 32 chip enables pin 9 output enable, pin 36 write enable, interrupt pin 37, reset pin 41, and register REG pin 44. REG pin 44 is the Attribute Memory Select, defined based on the CF mode of operation, i.e. PCMCIA I/O mode, IDE or PCMCIA Memory Mode. Several pins in the 50-pin interface are not connected.

The smaller SmartMedia interface also has a parallel data bus of 8 bits. These are mapped to pins 2-6, and 21-23 of the CompactFlash interface to match the CompactFlash D0:7 signals. While no separate address bus is provided, address and data are multiplexed. Control signals for latch enables, write enable and protect, output enable, and ready handshake are among the control signals. Output enable—OE and write enable—WE are mapped to the same function pins 9, 36 of the CompactFlash interface. The total number of pins in the SmartMedia interface is 22.

The Memory Stick and MMC/SD flash-memory-card interfaces are smaller still, since parallel data or address busses are not present. Instead, serial data transfers occur through serial data pin DIO, which is mapped to pin 19 (A1). Data is clocked in synchronization to clock SCLK on pin 18. A command signal CMD or BS occupies pin 20 (A0). The MMC/SD and Memory Stick interfaces require only 6 pins plus power and ground.

Detection logic in converter chip 40 reads card-select pins CD0, CD1 to detect the presence of a flash-memory card. When a new card is present, detection logic then reads pins A0, A1 as inputs to determine the card type. The pullup resistors of FIG. 4A together with wiring inside the adapter and the card's behavior determines whether A0, A1 are pulled low by the adapter or pulled high by the pullup resistors.

Figure 6:
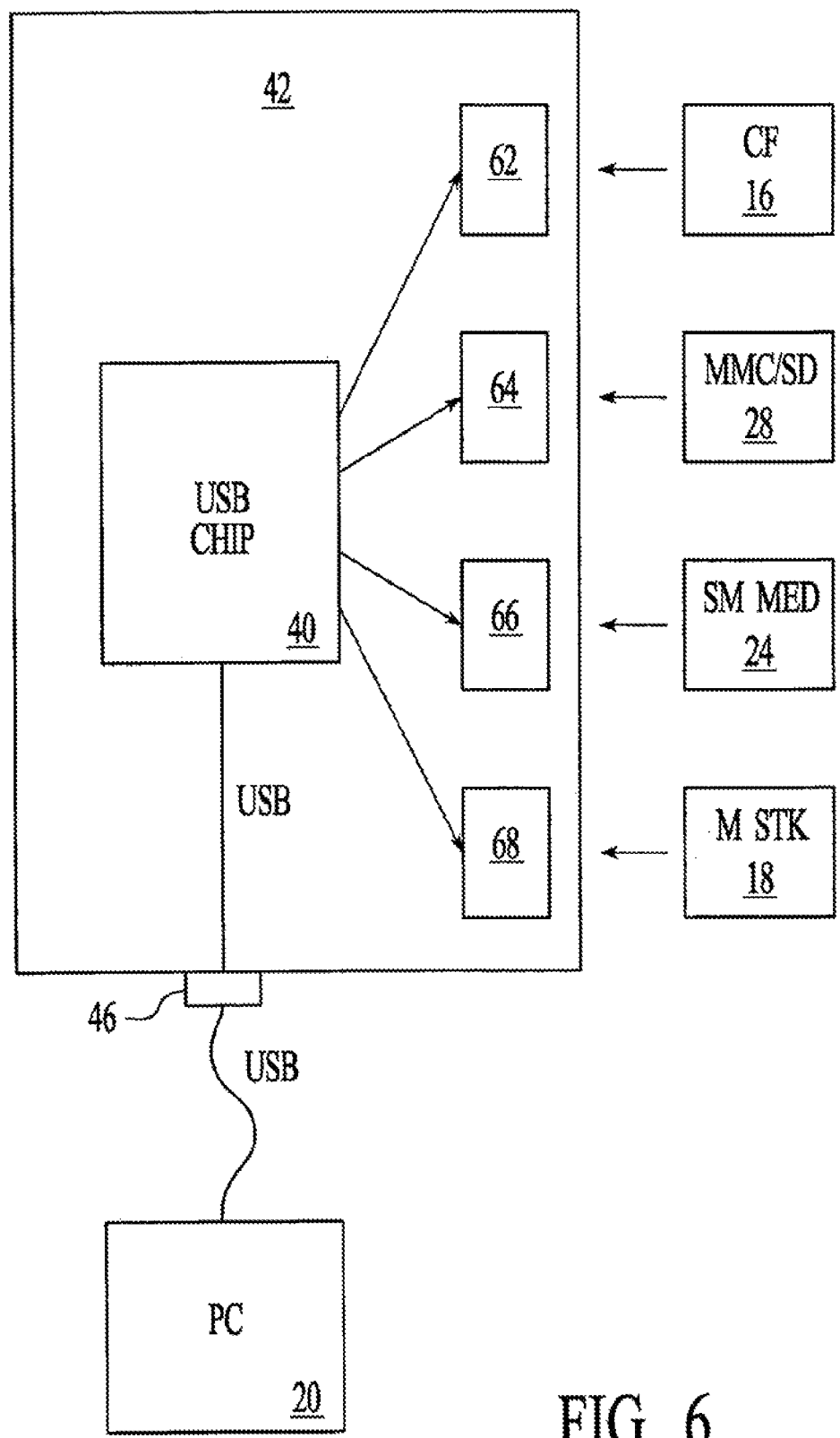
FIG. 6 is a diagram of a multi-slot embodiment of the flash-card reader.

Multi-Slot Multi-Flash-Card Reader—FIG. 6

FIG. 6 is a diagram of a multi-slot embodiment of the flash-card reader. While the single-slot embodiment of FIG. 3B results in the smallest physical design, somewhat larger flash-card readers can be made that have separate slots for each type of flash-memory card, rather than a single slot. This negates the need for the adapters.

Four connectors are provided in flash reader 42: a 50-pin CompactFlash connector 62 that fits CompactFlash card 16, a 9 pin MMC/SD connector 64 that fits MultiMediaCard 28 or a Secure Digital card, a 22 pin SmartMedia connector 66 that fits SmartMedia card 24, and a 10-pin Memory Stick connector 68 that fits Memory Stick 18.

Each of the four connectors 62, 64, 66, 68 route their signals to converter chip 40. Converter chip 40 detects when a flash-memory card has been inserted into one of the connectors 62, 64, 66, 68 and configures itself to read files from the inserted card using the pin interface of FIG. 5 corresponding to the card type.

Converter chip 40 executes various routines to perform handshaking with the flash-memory cards and accept data, either serially or in parallel. The data is buffered and then sent to the host PC 20 through USB connector 46. Converter chip 40 generates the appropriate USB-interface signals to transfer the data to host PC 20.

Having separate connectors 62, 64, 66, 68 with separate slots in flash reader 42 allows for card-to-card transfers. For example, images or other files from Memory Stick 18 could be transferred to CompactFlash card 16 by converter chip 40 reading serial data from Memory Stick inserted into connector 68, converting to parallel, and writing to connector 62 and CompactFlash card 16. Each of the flash-memory cards in connectors 62, 64, 66, 68 can be assigned a different drive letter by the operating system, such as e:, f:, g:, and h:.

In this embodiment, flash reader 42 is contained in an external housing that connects to host PC 20 through a USB cable. Of course, other cables and interfaces such as IEEE 1394 FireWire may be substituted.

Figure 7:
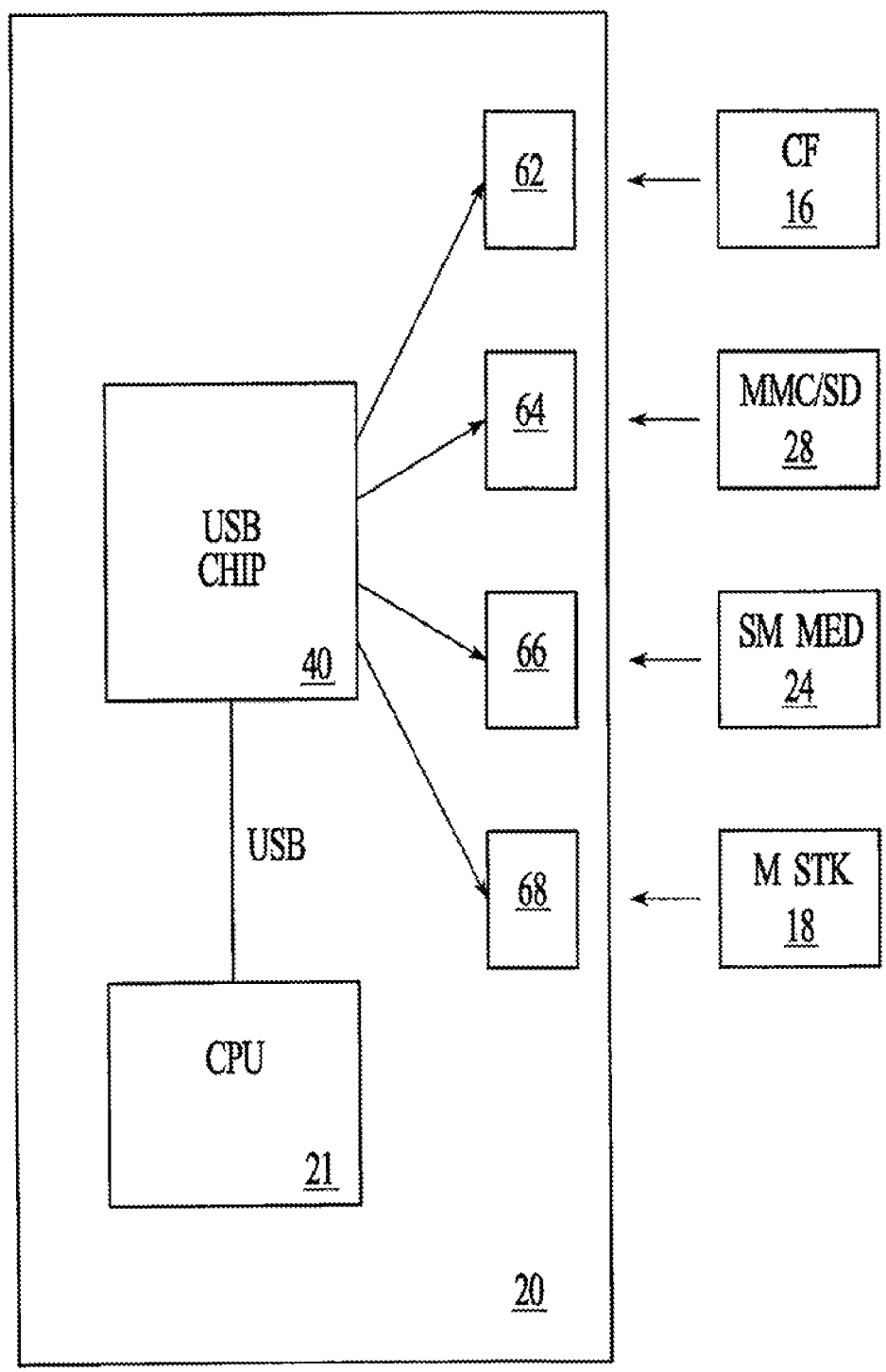
FIG. 7 shows a flash memory reader within a PC.

Flash Reader Within PC—FIG. 7

FIG. 7 shows a flash-memory reader within a PC. Four slots and four connectors are provided in flash reader 42. A 50-pin CompactFlash connector 62 fits CompactFlash card 16, a 9-pin MMC/SD connector 64 fits MultiMediaCard 28 or a Secure Digital card, a 22-pin SmartMedia connector 66 fits SmartMedia card 24, and a 10-pin Memory Stick connector 68 fits Memory Stick 18.

Each of the four connectors 62, 64, 66, 68 route their signals to converter chip 40. Converter chip 40 detects when a flash-memory card has been inserted into one of the connectors 62, 64, 66, 68 and configures itself to read files from the inserted card using the pin interface of FIG. 5 corresponding to the card type. Each of the flash-memory cards in connectors 62, 64, 66, 68 can be assigned a different drive letter by the operating system, such as e:, f:, g:, and h:.

Converter chip 40 executes various routines to perform handshaking with the flash-memory cards and accept data, either serially or in parallel. The data is buffered and then sent to the CPU 21 in PC 20 through an internal USB bus. Converter chip 40 generates the appropriate USB-interface signals to transfer the data to CPU 21.

Figure 8:
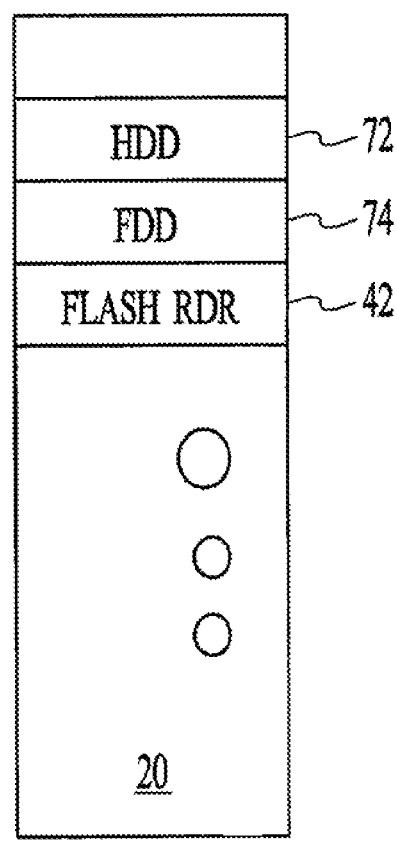
FIG. 8 shows a PC chassis with a flash-card reader in one of the drive bays.

FIG. 8 shows a PC chassis with a flash-card reader in one of the drive bays. PC 20 is enclosed by a chassis or case that has several drive bays allowing the user or manufacturer to insert peripherals such as hard and floppy disk drives, CDROM and DVD drives, and tape drives. HDD bay 72 contains a hard-disk drive, while FDD bay 74 contains a floppy disk drive. These are connected by cables to cards inserted into a USB, ATA, or other expansion bus connectors on the motherboard.

Flash reader 42 is inserted into one of the drive bays. The four slots face forward, allowing the user to insert flash-memory cards into flash reader 42 much as a floppy disk is inserted into the floppy-disk drive in FDD bay 74.

Flash reader 42 can be installed by the user from a kit purchased at a store, or it can be pre-installed by an original-equipment manufacturer (OEM) or retailer. The user can easily transfer digital images from a digital camera, regardless of the type of flash-card used by the camera, due to the many different formats of flash-memory cards read by flash reader 42.

Figure 9:
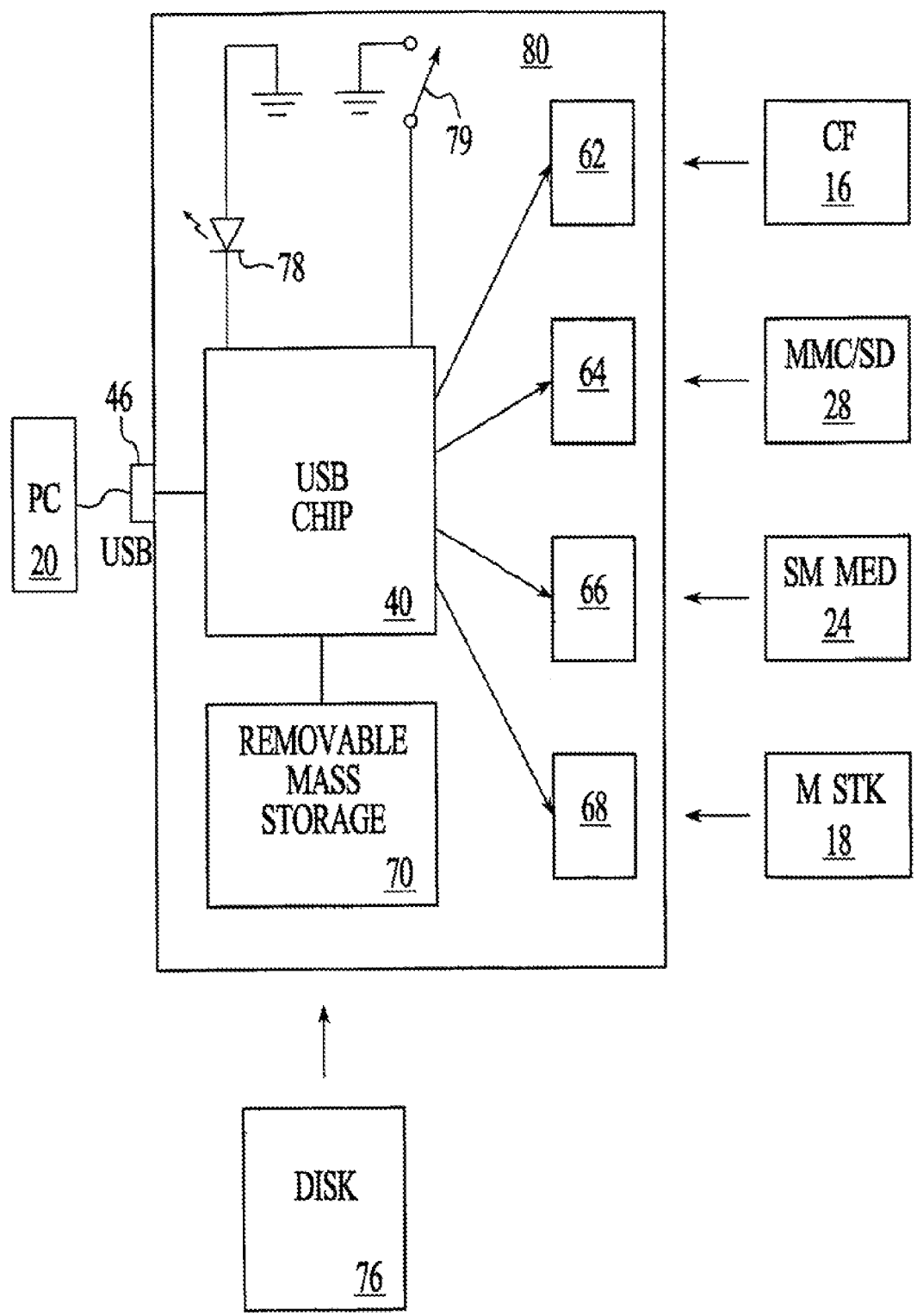
FIG. 9 is a diagram of a stand-alone FlashToaster that accepts several formats of flash-memory cards and can copy images to a removable disk without being connected to a host PC.

FlashToaster—FIG. 9

FIG. 9 is a diagram of a stand-alone FlashToaster that accepts several formats of flash-memory cards and can copy images to a removable disk without being connected to a host PC. Digital photographers may not always have their PC's nearby. While extra flash-memory cards can be purchased and swapped in the digital camera, these flash-memory cards are somewhat expensive, especially when many high resolution images are captured. Especially during a long trip away from the PC, the user may be limited by the capacity of the flash-memory cards.

FlashToaster 80 has four slots and four connectors are provided in FlashToaster 80. A 50-pin CompactFlash connector 62 fits CompactFlash card 16, a 9-pin MMC/SD connector 64 fits MultiMediaCard 28 or a Secure Digital card, a 22-pin SmartMedia connector 66 fits SmartMedia card 24, and a 10-pin Memory Stick connector 68 fits Memory Stick 18.

Each of the four connectors 62, 64, 66, 68 route their signals to converter chip 40. Converter chip 40 detects when a flash-memory card has been inserted into one of the connectors 62, 64, 68 by sensing card select lines CD0, CD1 and configures itself to read files from the inserted card using the pin interface of FIG. 5 corresponding to the card type.

Converter chip 40 executes various routines to perform handshaking with the flash-memory cards and accept data, either serially or in parallel. The data is buffered and then sent either to host PC 20 through USB connector 46 or to removable mass storage 70 Converter chip 40 generates the appropriate USB-interface signals to transfer the data to host PC 20. Converter chip 40 also generates the control signals for removable mass storage 70, allowing the image data read from the flash-memory card to be written to removable disk 76. Removable disk 76 could be a standard or a high-density floppy diskette, a tape drive, a writeable CD-R/W disk, or other proprietary media such as LS120 by Imation of Oakdale, Minn., or ZIP drives by Iomega Corp. of Roy, Utah.

Each of the flash-memory cards in connectors 62, 64, 66, 68 can be assigned a different drive letter by the operating system, such as e:, f:, g:, and h:. Removable mass storage 70 can also be assigned a drive letter.

When FlashToaster 80 is not attached to host PC 20, image files may still be copied to removable mass storage 70. FlashToaster 80 may be carried along on a trip by the user, allowing the user to download image files to removable disk 76. Since removable disk 76 ordinarily has a much higher capacity than the flash-memory cards, many pictures may be captured when no access to host PC 20 is available. FlashToaster 80 can be provided with battery power or with its own AC converter.

FlashToaster 80 is provided with a simple user interface, including light-emitting diode LED 78 and button 79. When the user inserts a flash-memory card into one of connectors 62, 64, 66, 68, and removable disk 7,6 is inserted into removable mass storage 70, the user presses button 79. This activates controller chip 40, which determines which of connectors 62, 64, 66, 68 has a memory card inserted, and copies the image files to removable mass storage 70. LED 78 can be programmed to blink during the copying process, and remain lit when the copying is complete, or vice-versa. This provides a simple visual indication to the user of the copying progress. Errors can be indicated With additional LED indicator lamps, or other blinking arrangements or colors.

Figure 10:
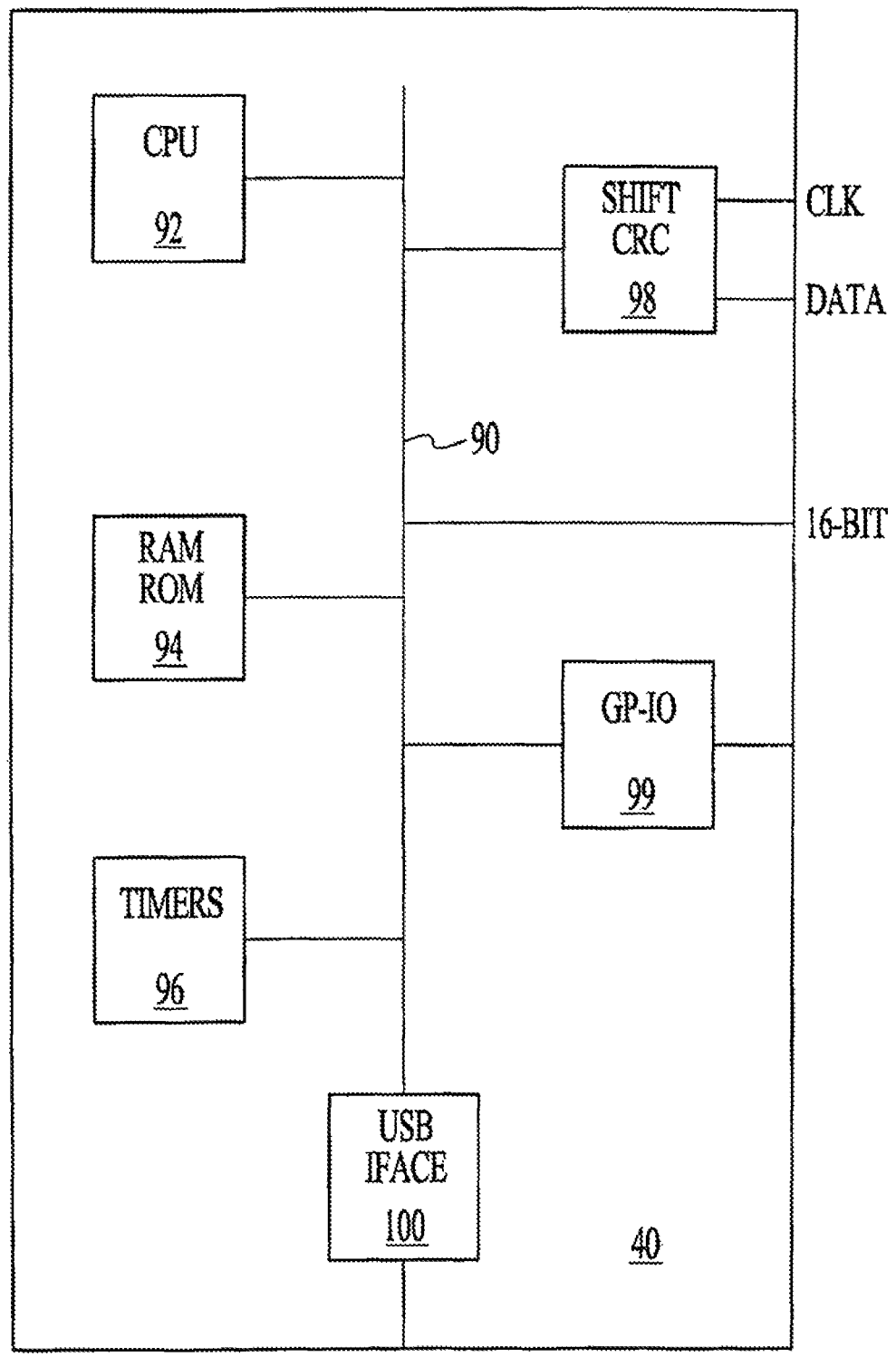
FIG. 10 is a diagram of the converter chip for the flash-memory reader.

Converter Chip—FIG. 10 FIG. 10 is a diagram of the converter chip for the flash-memory reader. Converter chip 40 can be implemented as a commercially-available micro-controller chip that is programmed to read and write I/O pins that are connected to the flashmemory-card connectors and USB interface. Several different control and transfer routines are written and programmed into RAM/ROM 94. CPU 92 then executes these routines. A high-level scanning routine can sense when a flash-memory card is inserted. CPU 92 can then begin execution of another routine specific to that type of flash-memory card. Transfer and handshake sub-routines can then be called.

General purpose input-output GPIO 99 provides registers or 1/0 ports that drive external I/O pins of converter chip 40, or read the logic-levels or voltages on input pins to converter chip 40. CPU 92 can read registers in GPIO 99 that are written by control signals that are coupled to I/O pins of converter chip 40 from connectors 62, 64, 66, 68. Control signals to the flash-memory cards can be switched high or low by writing a 1 or a 0 to a register for that control signal in GPIO 99.

Timers 96 are useful for asserting control signals for a required amount of time. For example, a control signal may need to be asserted for a specified number of microseconds. CPU 92 can write a 1 to a register in GPIO 99 and start a timer in timers 96 Timer 6 can send an interrupt to CPU 96 when the specified time has elapsed, or CPU 92 can continuously or periodically poll timers 96 to determine when the specified time has elapsed. Then CPU 92 can write a 0 to the register in GPIO 99, causing the control signal to transition from 1 to 0.

Shifter 98 is connected to the data and clock signals from connectors 64, 68. When data is read from the flash-memory card, a clock is pulsed to synchronize the data transfer. Shifter 98 clocks in one bit (serial) or word (parallel) of data for each clock pulse. A cyclical-redundancy-check (CRC) can be performed on the data to detect errors. CPU 92 can request re-transmission of data from the flash-memory card when an error is detected.

Data read by shifter 98 can be sent over internal bus 90 to be stored in a buffer in RAM/ROM 94. Later, CPU 92 can execute a routine to transfer this data from RAM/ROM 94 to USB interface 100. USB interface 100 then transmits the data over an external USB link to a host PC. When a removable mass storage is present, some of the I/O pins from GPIO 99 can connect to the removable mass storage, or a separate disk controller can be included on controller chip 40.

ADVANTAGES OF THE INVENTION

A universal adapter for flash-memory cards accepts cards of several different formats. The adapter accepts SmartMedia, MultiMediaCard, Secure Digital, and Memory Stick cards. The flash-card reader with a single slot accepts any format card using the adapter. Special detection logic on the flash reader distinguishes between the many flash-card formats. The low-cost passive adapter does not need an expensive converter chip. A multi-format reader is ideal for use with a PC. However, a stand-alone flash reader can copy image files from flash cards without a PC. Additionally, preparation of media for use in devices (format and erase operations) can be done using this reader.

A universal adapter is constructed using the Compact-Flash card form factor. A reader that reads CompactFlash cards can then read any of the other flash-memory cards that plug into the CompactFlash adapter. The adapters are simple, inexpensive passive adapters without a conversion chip.

The disclosed pin mapping from the smaller flash-card formats to CompactFlash allows for easy detection of the type of flash-memory card inserted into the adapter. Detection of the type of flash-memory card is thus performed automatically by electronic detection by the CompactFlash reader. The CompactFlash reader is modified to perform this card-type detection. Signal conversion such as serial-to-parallel is performed by the CompactFlash reader rather than by the adapter. Adapter costs are reduced while CompactFlash reader cost is increased only slightly. The CompactFlash reader can use a single CompactFlash slot to read multiple flashcard types, including SmartMedia, MultiMediaCard, Secure Digital, Memory Stick, and CompactFlash.

ALTERNATE EMBODIMENTS

Several other embodiments are contemplated by the inventors. Different flash-card formats can be supported such as Smart Cards, and more or less than the four slots shown in the multi-card flash reader can be included. Other adapters can be used for newer flash formats for the single-slot CompactFlash reader. Any device that needs Control Bus, Clock, Data Bus and Address Bus can be designed to fit into this slot. Examples of such devices include (but are not limited to) DSL Modems, Fingerprint security devices, Miniature Hard disks, etc.

While the invention has been described as connecting to a personal computer PC host, the host may also be an Apple computer such as the iMAC or G3. The host may also be a SUN computer, or any host computer using USB or IDE interfaces. The invention can also apply to Personal Digital Assistants (PDAs) such as by Palm Computer or other handheld appliances such as a Cell phone with USB capability.

The term "CompactFlash reader" has been used for simplicity, since digital images are often read from the flash-memory card and then written to the PC. However, the CompactFlash reader is capable of reading files from the PC or from another flash-memory card and writing the file to the flash-memory card. Thus the CompactFlash reader is really a reader/writer.

In another embodiment, the CompactFlash reader is somewhat larger, and has multiple slots. The adapter is not needed in this embodiment. Instead, a slot is provided for each of the flash-memory card formats—SmartMedia, MultiMediaCard, Secure Digital, Memory Stick, and CompactFlash. A PCMCIA slot can also be added. This CompactFlash reader can be connected to the PC by a USB cable, or it can be located within the PC chassis.

In a third embodiment, the CompactFlash reader is a stand-alone device that can operate without a PC. A removable disk media such as a R/W CD-ROM is included. Images from the flash-memory card are copied to the removable disk media by the CompactFlash reader. A simple interface is used, such as having the user presses a button to initiate image transfer.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A flash memory card reader, comprising:
   at least two flash memory card connectors, at least one flash memory card connector configured for serial data transfer and at least one flash memory card connector configured for parallel data transfer; and
   a single-chip converter comprising:
      a serial I/O circuit configured for serial data transfer, the serial I/O circuit supporting multiple serial data transfer modes; and
      a parallel I/O circuit configured for parallel data transfer.

2. The flash memory card reader of claim 1,
   wherein said serial I/O circuit is configured to communicate one bit of serial data per clock in a one-bit serial data transfer mode.

3. The flash memory card reader of claim 2,
   wherein said serial I/O circuit is configured to communicate multiple bits of serial data per clock in a parallel serial data transfer mode.

4. The flash memory card reader of claim 1,
   wherein said serial I/O circuit is configured to communicate multiple bits of serial data per clock in a parallel serial data transfer mode.

5. The flash memory card reader of claim 1,
wherein the single converter chip is further configured to perform a CRC check on received data to detect errors.

6. The flash memory card reader of claim 5,
wherein the single converter chip is further configured to request retransmission when an error is detected.

7. The flash memory card reader of claim 1,
wherein the single converter chip is further configured to store read data in a buffer.

8. The flash memory card reader of claim 1,
wherein the parallel I/O circuit comprises a general purpose input output circuit having at least one register or I/O port connected to external I/O pins of the single converter chip.

9. The flash memory card reader of claim 8
further comprising a CPU adapted to read from or write to said at least one register.

10. The flash memory card reader of claim 1,
further comprising at least two slots, one slot configured with at least one serial data transfer flash memory card connector and a second slot configured with at least one parallel data transfer flash memory card connector.

11. Apparatus, comprising:
a single-chip converter comprising:
  a serial I/O circuit configured for serial data transfer, the serial I/O circuit supporting multiple serial data transfer modes; and
  a parallel I/O circuit configured for parallel data transfer.

12. Apparatus according to claim 11,
wherein said serial I/O circuit is configured to communicate one bit of serial data per clock in a one-bit serial data transfer mode.

13. Apparatus according to claim 12,
wherein said serial I/O circuit is configured to communicate multiple bits of serial data per clock in a parallel serial data transfer mode.

14. Apparatus according to claim 11,
wherein said serial I/O circuit is configured to communicate multiple bits of serial data per clock in a parallel serial data transfer mode.

15. Apparatus according to claim 11,
wherein the single converter chip is further configured to perform a CRC check on received data to detect errors.

16. Apparatus according to claim 15,
wherein the single converter chip is further configured to request retransmission when an error is detected.

17. Apparatus according to claim 11,
wherein the single converter chip is further configured to store read data in a buffer.

18. Apparatus according to claim 11,
wherein the parallel I/O circuit comprises a general purpose input output circuit having at least one register or I/O port connected to external I/O pins of the single converter chip.

19. Apparatus according to claim 18,
further comprising a CPU adapted to read from or write to said at least one register.

* * * * *